(12) United States Patent
Hendrix et al.

(10) Patent No.: US 11,765,499 B2
(45) Date of Patent: Sep. 19, 2023

(54) METHODS AND SYSTEMS FOR MANAGING MIXED MODE ELECTROMECHANICAL ACTUATOR DRIVE

(71) Applicant: Cirrus Logic International Semiconductor Ltd., Edinburgh (GB)

(72) Inventors: Jon D. Hendrix, Wimberley, TX (US); Emmanuel A. Marchais, Dripping Springs, TX (US); Nicholas Joseph, Austin, TX (US); Bryant Tran, Austin, TX (US); Marco A. Janko, Austin, TX (US); Noel Preecs, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 71 days.

(21) Appl. No.: 17/572,769

(22) Filed: Jan. 11, 2022

(65) Prior Publication Data
US 2022/0408181 A1 Dec. 22, 2022

Related U.S. Application Data

(60) Provisional application No. 63/213,612, filed on Jun. 22, 2021.

(51) Int. Cl.
*H04R 3/00* (2006.01)
*G06F 3/01* (2006.01)
*H03F 1/56* (2006.01)

(52) U.S. Cl.
CPC .............. *H04R 3/00* (2013.01); *G06F 3/016* (2013.01); *H03F 1/56* (2013.01); *H03F 2200/03* (2013.01); *H03F 2200/471* (2013.01)

(58) Field of Classification Search
CPC . H04R 3/00; G06F 3/016; G06F 3/041; H03F 1/56; H03F 2200/03; H03F 2200/471
See application file for complete search history.

(56) References Cited

U.S. PATENT DOCUMENTS

| | | |
|---|---|---|
| 3,686,927 A | 8/1972 | Scharton |
| 4,902,136 A | 2/1990 | Mueller et al. |
| (Continued) | | |

FOREIGN PATENT DOCUMENTS

| | | |
|---|---|---|
| AU | 2002347829 | 4/2003 |
| CN | 103165328 A | 6/2013 |
| (Continued) | | |

OTHER PUBLICATIONS

International Search Report and Written Opinion of the International Searching Authority, International Application No. PCT/GB2019/050964, dated Sep. 3, 2019.

(Continued)

*Primary Examiner* — David L Ton
(74) *Attorney, Agent, or Firm* — Jackson Walker L.L.P

(57) ABSTRACT

In accordance with embodiments of the present disclosure, a method of driving a playback waveform to an electromagnetic actuator by a transducer driving system may include operating the transducer driving system in a first mode wherein the electromagnetic actuator is driven with the playback waveform in a closed loop to form a closed-loop voltage drive system that includes a negative impedance, operating the transducer driving system in a second mode wherein the electromechanical actuator is driven with the playback waveform in an open loop, and operating a mode switch for transitioning the transducer driving system to operate between the first mode and the second mode.

34 Claims, 14 Drawing Sheets

(56) References Cited

U.S. PATENT DOCUMENTS

| | | |
|---|---|---|
| 5,374,896 A | 12/1994 | Sato et al. |
| 5,684,722 A | 11/1997 | Thorner et al. |
| 5,748,578 A | 5/1998 | Schell |
| 5,857,986 A | 1/1999 | Moriyasu |
| 6,050,393 A | 4/2000 | Murai et al. |
| 6,278,790 B1 | 8/2001 | Davis et al. |
| 6,294,891 B1 | 9/2001 | McConnell et al. |
| 6,332,029 B1 | 12/2001 | Azima et al. |
| 6,388,520 B2 | 5/2002 | Wada et al. |
| 6,567,478 B2 | 5/2003 | Oishi et al. |
| 6,580,796 B1 | 6/2003 | Kuroki |
| 6,683,437 B2 | 1/2004 | Fierling |
| 6,703,550 B2 | 3/2004 | Chu |
| 6,762,745 B1 | 7/2004 | Braun et al. |
| 6,768,779 B1 | 7/2004 | Nielsen |
| 6,784,740 B1 | 8/2004 | Tabatabaei |
| 6,816,833 B1 | 11/2004 | Iwamoto et al. |
| 6,906,697 B2 | 6/2005 | Rosenberg |
| 6,995,747 B2 | 2/2006 | Casebolt et al. |
| 7,042,286 B2 | 5/2006 | Meade et al. |
| 7,154,470 B2 | 12/2006 | Tierling |
| 7,277,678 B2 | 10/2007 | Rozenblit et al. |
| 7,333,604 B2 | 2/2008 | Zernovizky et al. |
| 7,392,066 B2 | 6/2008 | Haparnas |
| 7,456,688 B2 | 11/2008 | Okazaki et al. |
| 7,623,114 B2 | 11/2009 | Rank |
| 7,639,232 B2 | 12/2009 | Grant et al. |
| 7,777,566 B1 | 8/2010 | Drogi et al. |
| 7,791,588 B2 | 9/2010 | Tierling et al. |
| 7,825,838 B1 | 11/2010 | Srinivas et al. |
| 7,979,146 B2 | 7/2011 | Ullrich et al. |
| 8,068,025 B2 | 11/2011 | Devenyi et al. |
| 8,098,234 B2 | 1/2012 | Lacroix et al. |
| 8,102,364 B2 | 1/2012 | Tierling |
| 8,325,144 B1 | 12/2012 | Tierling et al. |
| 8,427,286 B2 | 4/2013 | Grant et al. |
| 8,441,444 B2 | 5/2013 | Moore et al. |
| 8,466,778 B2 | 6/2013 | Hwang et al. |
| 8,480,240 B2 | 7/2013 | Kashiyama |
| 8,572,293 B2 | 10/2013 | Cruz-Hernandez et al. |
| 8,572,296 B2 | 10/2013 | Cruz-Hernandez et al. |
| 8,593,269 B2 | 11/2013 | Grant et al. |
| 8,648,659 B2 | 2/2014 | Oh et al. |
| 8,648,829 B2 | 2/2014 | Shahoian |
| 8,659,208 B1 | 2/2014 | Rose et al. |
| 8,754,757 B1 | 6/2014 | Ullrich et al. |
| 8,754,758 B1 | 6/2014 | Ullrich et al. |
| 8,947,216 B2 | 2/2015 | Da Costa et al. |
| 8,981,915 B2 | 3/2015 | Birnbaum et al. |
| 8,994,518 B2 | 3/2015 | Gregorio et al. |
| 9,019,087 B2 | 4/2015 | Bakircioglu et al. |
| 9,030,428 B2 | 5/2015 | Fleming |
| 9,063,570 B2 | 6/2015 | Weddle et al. |
| 9,070,856 B1 | 6/2015 | Rose et al. |
| 9,083,821 B2 | 7/2015 | Hughes |
| 9,092,059 B2 | 7/2015 | Bhatia |
| 9,117,347 B2 | 8/2015 | Matthews |
| 9,128,523 B2 | 9/2015 | Buuck et al. |
| 9,164,587 B2 | 10/2015 | Da Costa et al. |
| 9,196,135 B2 | 11/2015 | Shah et al. |
| 9,248,840 B2 | 2/2016 | Truong |
| 9,326,066 B2 | 4/2016 | Kilppel |
| 9,329,721 B1 | 5/2016 | Buuck et al. |
| 9,354,704 B2 | 5/2016 | Lacroix et al. |
| 9,368,005 B2 | 6/2016 | Cruz-Hernandez et al. |
| 9,489,047 B2 | 11/2016 | Jiang et al. |
| 9,495,013 B2 | 11/2016 | Underkoffler et al. |
| 9,507,423 B2 | 11/2016 | Gandhi et al. |
| 9,513,709 B2 | 12/2016 | Gregorio et al. |
| 9,520,036 B1 | 12/2016 | Buuck |
| 9,588,586 B2 | 3/2017 | Rihn |
| 9,640,047 B2 | 5/2017 | Choi et al. |
| 9,652,041 B2 | 5/2017 | Jiang et al. |
| 9,696,859 B1 | 7/2017 | Heller et al. |
| 9,697,450 B1 | 7/2017 | Lee |
| 9,715,300 B2 | 7/2017 | Sinclair |
| 9,740,381 B1 | 8/2017 | Chaudhri et al. |
| 9,842,476 B2 | 12/2017 | Rihn et al. |
| 9,864,567 B2 | 1/2018 | Seo |
| 9,881,467 B2 | 1/2018 | Levesque |
| 9,886,829 B2 | 2/2018 | Levesque |
| 9,946,348 B2 | 4/2018 | Ullrich et al. |
| 9,947,186 B2 | 4/2018 | Macours |
| 9,959,744 B2 | 5/2018 | Koskan et al. |
| 9,965,092 B2 | 5/2018 | Smith |
| 10,032,550 B1 | 7/2018 | Zhang et al. |
| 10,039,080 B2 | 7/2018 | Miller et al. |
| 10,055,950 B2 | 8/2018 | Saboune et al. |
| 10,074,246 B2 | 9/2018 | Da Costa et al. |
| 10,102,722 B2 | 10/2018 | Levesque et al. |
| 10,110,152 B1 | 10/2018 | Hajati |
| 10,171,008 B2 | 1/2019 | Nishitani et al. |
| 10,175,763 B2 | 1/2019 | Shah |
| 10,191,579 B2 | 1/2019 | Forlines et al. |
| 10,264,348 B1 | 4/2019 | Harris et al. |
| 10,275,087 B1 | 4/2019 | Smith |
| 10,402,031 B2 | 9/2019 | Vandermeijden et al. |
| 10,564,727 B2 | 2/2020 | Billington et al. |
| 10,620,704 B2 | 4/2020 | Rand et al. |
| 10,667,051 B2 | 5/2020 | Stahl |
| 10,726,683 B1 | 7/2020 | Mondello et al. |
| 10,735,956 B2 | 8/2020 | Bae et al. |
| 10,782,785 B2 | 9/2020 | Hu et al. |
| 10,795,443 B2 | 10/2020 | Hu et al. |
| 10,820,100 B2 | 10/2020 | Stahl et al. |
| 10,828,672 B2 | 11/2020 | Stahl et al. |
| 10,832,537 B2 | 11/2020 | Doy et al. |
| 10,841,696 B2 | 11/2020 | Mamou-Mani |
| 10,848,886 B2 | 11/2020 | Rand |
| 10,860,202 B2 | 12/2020 | Sepehr et al. |
| 10,955,955 B2 | 3/2021 | Peso Parada et al. |
| 10,969,871 B2 | 4/2021 | Rand et al. |
| 10,976,825 B2 | 4/2021 | Das et al. |
| 11,069,206 B2 | 7/2021 | Rao et al. |
| 11,079,874 B2 | 8/2021 | Lapointe et al. |
| 11,139,767 B2 | 10/2021 | Janko et al. |
| 11,150,733 B2 | 10/2021 | Das et al. |
| 11,259,121 B2 | 2/2022 | Lindemann et al. |
| 11,263,877 B2 | 3/2022 | Marchais et al. |
| 11,460,526 B1 | 10/2022 | Foo et al. |
| 11,500,469 B2 | 11/2022 | Rao et al. |
| 2001/0043714 A1 | 11/2001 | Asada et al. |
| 2002/0018578 A1 | 2/2002 | Burton |
| 2002/0085647 A1 | 7/2002 | Oishi et al. |
| 2003/0068053 A1 | 4/2003 | Chu |
| 2003/0214485 A1 | 11/2003 | Roberts |
| 2005/0031140 A1 | 2/2005 | Browning |
| 2005/0134562 A1 | 6/2005 | Grant et al. |
| 2005/0195919 A1 | 9/2005 | Cova |
| 2006/0028095 A1 | 2/2006 | Maruyama et al. |
| 2006/0197753 A1 | 9/2006 | Hotelling |
| 2007/0013337 A1 | 1/2007 | Liu et al. |
| 2007/0024254 A1 | 2/2007 | Radecker et al. |
| 2007/0241816 A1 | 10/2007 | Okazaki et al. |
| 2008/0077367 A1 | 3/2008 | Odajima |
| 2008/0226109 A1 | 9/2008 | Yamakata et al. |
| 2008/0240458 A1 | 10/2008 | Goldstein et al. |
| 2008/0293453 A1 | 11/2008 | Atlas et al. |
| 2008/0316181 A1 | 12/2008 | Nurmi |
| 2009/0020343 A1 | 1/2009 | Rothkopf et al. |
| 2009/0079690 A1 | 3/2009 | Watson et al. |
| 2009/0088220 A1 | 4/2009 | Persson |
| 2009/0096632 A1 | 4/2009 | Ullrich et al. |
| 2009/0102805 A1 | 4/2009 | Meijer et al. |
| 2009/0128306 A1 | 5/2009 | Luden et al. |
| 2009/0153499 A1 | 6/2009 | Kim et al. |
| 2009/0189867 A1 | 7/2009 | Krah et al. |
| 2009/0278819 A1 | 11/2009 | Goldenberg et al. |
| 2009/0279719 A1 | 11/2009 | Lesso |
| 2009/0313542 A1 | 12/2009 | Cruz-Hernandez et al. |
| 2010/0013761 A1 | 1/2010 | Birnbaum et al. |
| 2010/0080331 A1 | 4/2010 | Garudadr et al. |
| 2010/0085317 A1 | 4/2010 | Park et al. |
| 2010/0141408 A1 | 6/2010 | Doy et al. |

(56) References Cited

U.S. PATENT DOCUMENTS

| | | |
|---|---|---|
| 2010/0141606 A1 | 6/2010 | Bae et al. |
| 2010/0260371 A1 | 10/2010 | Afshar |
| 2010/0261526 A1 | 10/2010 | Anderson et al. |
| 2010/0331685 A1 | 12/2010 | Stein et al. |
| 2011/0056763 A1 | 3/2011 | Tanase et al. |
| 2011/0075835 A1 | 3/2011 | Hill |
| 2011/0077055 A1 | 3/2011 | Pakula et al. |
| 2011/0141052 A1 | 6/2011 | Bernstein et al. |
| 2011/0161537 A1 | 6/2011 | Chang |
| 2011/0163985 A1 | 7/2011 | Bae et al. |
| 2011/0167391 A1 | 7/2011 | Momeyer et al. |
| 2012/0011436 A1 | 1/2012 | Jinkinson et al. |
| 2012/0105358 A1 | 5/2012 | Momeyer et al. |
| 2012/0105367 A1 | 5/2012 | Son et al. |
| 2012/0112894 A1 | 5/2012 | Yang et al. |
| 2012/0206246 A1 | 8/2012 | Cruz-Hernandez et al. |
| 2012/0206247 A1 | 8/2012 | Bhatia et al. |
| 2012/0229264 A1 | 9/2012 | Company Bosch et al. |
| 2012/0249462 A1 | 10/2012 | Flanagan et al. |
| 2012/0253698 A1 | 10/2012 | Cokonaj |
| 2012/0306631 A1 | 12/2012 | Hughes |
| 2013/0016855 A1 | 1/2013 | Lee et al. |
| 2013/0027359 A1 | 1/2013 | Schevin et al. |
| 2013/0038792 A1 | 2/2013 | Quigley et al. |
| 2013/0096849 A1 | 4/2013 | Campbell et al. |
| 2013/0141382 A1 | 6/2013 | Simmons et al. |
| 2013/0275058 A1 | 10/2013 | Awad |
| 2013/0289994 A1 | 10/2013 | Newman et al. |
| 2013/0307786 A1 | 11/2013 | Heubel |
| 2014/0035736 A1 | 2/2014 | Weddle et al. |
| 2014/0056461 A1 | 2/2014 | Afshar |
| 2014/0064516 A1 | 3/2014 | Cruz-Hernandez et al. |
| 2014/0079248 A1 | 3/2014 | Short et al. |
| 2014/0085064 A1 | 3/2014 | Crawley et al. |
| 2014/0118125 A1 | 5/2014 | Bhatia |
| 2014/0118126 A1 | 5/2014 | Garg et al. |
| 2014/0119244 A1 | 5/2014 | Steer et al. |
| 2014/0125467 A1 | 5/2014 | Da Costa et al. |
| 2014/0139327 A1 | 5/2014 | Bau et al. |
| 2014/0176415 A1 | 6/2014 | Buuck et al. |
| 2014/0205260 A1 | 7/2014 | Lacroix et al. |
| 2014/0222377 A1 | 8/2014 | Bitan et al. |
| 2014/0226068 A1 | 8/2014 | Lacroix et al. |
| 2014/0253303 A1 | 9/2014 | Levesque |
| 2014/0292501 A1 | 10/2014 | Lim et al. |
| 2014/0300454 A1 | 10/2014 | Lacroix et al. |
| 2014/0340209 A1 | 11/2014 | Lacroix et al. |
| 2014/0347176 A1 | 11/2014 | Modarres et al. |
| 2015/0049882 A1 | 2/2015 | Chiu et al. |
| 2015/0061846 A1 | 3/2015 | Yliaho |
| 2015/0070149 A1 | 3/2015 | Cruz-Hernandez et al. |
| 2015/0070151 A1 | 3/2015 | Cruz-Hernandez et al. |
| 2015/0070154 A1 | 3/2015 | Levesque et al. |
| 2015/0070260 A1 | 3/2015 | Saboune et al. |
| 2015/0077324 A1 | 3/2015 | Birnbaum et al. |
| 2015/0084752 A1 | 3/2015 | Heubel et al. |
| 2015/0116205 A1 | 4/2015 | Westerman et al. |
| 2015/0130767 A1 | 5/2015 | Myers et al. |
| 2015/0204925 A1 | 7/2015 | Hernandez et al. |
| 2015/0208189 A1 | 7/2015 | Tsai |
| 2015/0216762 A1 | 8/2015 | Oohashi et al. |
| 2015/0234464 A1 | 8/2015 | Yliaho |
| 2015/0264455 A1 | 9/2015 | Granoto et al. |
| 2015/0268768 A1 | 9/2015 | Woodhull et al. |
| 2015/0324116 A1 | 11/2015 | Marsden et al. |
| 2015/0325116 A1 | 11/2015 | Umminger, III |
| 2015/0339898 A1 | 11/2015 | Saboune et al. |
| 2015/0341714 A1 | 11/2015 | Ahn et al. |
| 2015/0356981 A1 | 12/2015 | Johnson et al. |
| 2016/0004311 A1 | 1/2016 | Yliaho |
| 2016/0007095 A1 | 1/2016 | Lacroix |
| 2016/0063826 A1 | 3/2016 | Morrell et al. |
| 2016/0070392 A1 | 3/2016 | Wang et al. |
| 2016/0074278 A1 | 3/2016 | Muench et al. |
| 2016/0097662 A1 | 4/2016 | Chang et al. |
| 2016/0132118 A1 | 5/2016 | Park et al. |
| 2016/0155305 A1* | 6/2016 | Barsilai ............ G08B 6/00 340/407.1 |
| 2016/0162031 A1 | 6/2016 | Westerman et al. |
| 2016/0179203 A1 | 6/2016 | Modarres et al. |
| 2016/0187987 A1 | 6/2016 | Ullrich et al. |
| 2016/0239089 A1 | 8/2016 | Taninaka et al. |
| 2016/0246378 A1 | 8/2016 | Sampanes et al. |
| 2016/0277821 A1 | 9/2016 | Kunimoto |
| 2016/0291731 A1 | 10/2016 | Liu et al. |
| 2016/0305996 A1 | 10/2016 | Martens et al. |
| 2016/0328065 A1 | 11/2016 | Johnson et al. |
| 2016/0358605 A1 | 12/2016 | Ganong, III et al. |
| 2017/0031495 A1 | 2/2017 | Smith |
| 2017/0052593 A1 | 2/2017 | Jiang et al. |
| 2017/0078804 A1 | 3/2017 | Guo et al. |
| 2017/0083096 A1 | 3/2017 | Rihn et al. |
| 2017/0090572 A1 | 3/2017 | Holenarsipur et al. |
| 2017/0090573 A1 | 3/2017 | Hajati et al. |
| 2017/0097381 A1 | 4/2017 | Stephens et al. |
| 2017/0153760 A1 | 6/2017 | Chawda et al. |
| 2017/0168574 A1 | 6/2017 | Zhang |
| 2017/0168773 A1 | 6/2017 | Keller et al. |
| 2017/0169674 A1 | 6/2017 | Macours |
| 2017/0180863 A1 | 6/2017 | Biggs et al. |
| 2017/0220197 A1 | 8/2017 | Matsumoto et al. |
| 2017/0256145 A1 | 9/2017 | Macours et al. |
| 2017/0277350 A1 | 9/2017 | Wang et al. |
| 2017/0357440 A1 | 12/2017 | Tse |
| 2018/0021811 A1 | 1/2018 | Kutej et al. |
| 2018/0033946 A1 | 2/2018 | Kemppinen et al. |
| 2018/0059733 A1 | 3/2018 | Gault et al. |
| 2018/0059793 A1 | 3/2018 | Hajati |
| 2018/0067557 A1 | 3/2018 | Robert et al. |
| 2018/0074637 A1 | 3/2018 | Rosenberg et al. |
| 2018/0082673 A1 | 3/2018 | Tzanetos |
| 2018/0084362 A1 | 3/2018 | Zhang et al. |
| 2018/0095596 A1 | 4/2018 | Turgeman |
| 2018/0151036 A1 | 5/2018 | Cha et al. |
| 2018/0158289 A1 | 6/2018 | Vasilev et al. |
| 2018/0159452 A1 | 6/2018 | Eke et al. |
| 2018/0159457 A1 | 6/2018 | Eke |
| 2018/0159545 A1 | 6/2018 | Eke et al. |
| 2018/0160227 A1 | 6/2018 | Lawrence et al. |
| 2018/0165925 A1 | 6/2018 | Israr et al. |
| 2018/0178114 A1 | 6/2018 | Mizuta et al. |
| 2018/0182212 A1 | 6/2018 | Li et al. |
| 2018/0183372 A1 | 6/2018 | Li et al. |
| 2018/0194369 A1 | 7/2018 | Lisseman et al. |
| 2018/0196567 A1 | 7/2018 | Klein et al. |
| 2018/0224963 A1 | 8/2018 | Lee et al. |
| 2018/0227063 A1 | 8/2018 | Heubel et al. |
| 2018/0237033 A1 | 8/2018 | Hakeem et al. |
| 2018/0206282 A1 | 9/2018 | Singh |
| 2018/0253123 A1 | 9/2018 | Levesque et al. |
| 2018/0255411 A1 | 9/2018 | Lin et al. |
| 2018/0267897 A1 | 9/2018 | Jeong |
| 2018/0294757 A1 | 10/2018 | Feng et al. |
| 2018/0301060 A1 | 10/2018 | Israr et al. |
| 2018/0304310 A1 | 10/2018 | Long et al. |
| 2018/0321056 A1 | 11/2018 | Yoo et al. |
| 2018/0321748 A1 | 11/2018 | Rao et al. |
| 2018/0323725 A1 | 11/2018 | Cox et al. |
| 2018/0329172 A1 | 11/2018 | Tabuchi |
| 2018/0335848 A1 | 11/2018 | Moussette et al. |
| 2018/0367897 A1 | 12/2018 | Bjork et al. |
| 2019/0020760 A1 | 1/2019 | DeBates et al. |
| 2019/0035235 A1 | 1/2019 | Da Costa et al. |
| 2019/0227628 A1 | 1/2019 | Rand et al. |
| 2019/0044651 A1 | 2/2019 | Nakada |
| 2019/0051229 A1 | 2/2019 | Ozguner et al. |
| 2019/0064925 A1 | 2/2019 | Kim et al. |
| 2019/0069088 A1 | 2/2019 | Seiler |
| 2019/0073078 A1 | 3/2019 | Sheng et al. |
| 2019/0102031 A1 | 4/2019 | Shutzberg et al. |
| 2019/0103829 A1 | 4/2019 | Vasudevan et al. |
| 2019/0138098 A1 | 5/2019 | Shah |
| 2019/0163234 A1 | 5/2019 | Kim et al. |
| 2019/0196596 A1 | 6/2019 | Yokoyama et al. |

(56) References Cited

U.S. PATENT DOCUMENTS

| | | |
|---|---|---|
| 2019/0206396 A1 | 7/2019 | Chen |
| 2019/0215349 A1 | 7/2019 | Adams et al. |
| 2019/0220095 A1 | 7/2019 | Ogita et al. |
| 2019/0228619 A1 | 7/2019 | Yokoyama et al. |
| 2019/0114496 A1 | 8/2019 | Lesso |
| 2019/0235629 A1 | 8/2019 | Hu et al. |
| 2019/0253031 A1 | 8/2019 | Vellanki et al. |
| 2019/0294247 A1 | 9/2019 | Hu et al. |
| 2019/0295755 A1 | 9/2019 | Konradi et al. |
| 2019/0296674 A1 | 9/2019 | Janko et al. |
| 2019/0297418 A1 | 9/2019 | Stahl |
| 2019/0305851 A1 | 10/2019 | Vegas-Olmos et al. |
| 2019/0311590 A1 | 10/2019 | Doy et al. |
| 2019/0341903 A1 | 11/2019 | Kim |
| 2019/0384393 A1 | 12/2019 | Cruz-Hernandez et al. |
| 2019/0384898 A1 | 12/2019 | Chen et al. |
| 2020/0117506 A1 | 4/2020 | Chan |
| 2020/0139403 A1 | 5/2020 | Palit |
| 2020/0150767 A1 | 5/2020 | Karimi Eskandary et al. |
| 2020/0218352 A1 | 7/2020 | Macours et al. |
| 2020/0231085 A1 | 7/2020 | Kunii et al. |
| 2020/0306796 A1 | 10/2020 | Lindemann et al. |
| 2020/0313529 A1 | 10/2020 | Lindemann |
| 2020/0313654 A1 | 10/2020 | Marchais et al. |
| 2020/0314969 A1 | 10/2020 | Marchais et al. |
| 2020/0342724 A1* | 10/2020 | Marchais ............... G06F 3/016 |
| 2020/0348249 A1 | 11/2020 | Marchais et al. |
| 2020/0403546 A1 | 12/2020 | Janko et al. |
| 2021/0108975 A1 | 4/2021 | Parada et al. |
| 2021/0125469 A1 | 4/2021 | Alderson |
| 2021/0153562 A1 | 5/2021 | Fishwick et al. |
| 2021/0157436 A1 | 5/2021 | Peso Parada et al. |
| 2021/0174777 A1 | 6/2021 | Marchais et al. |
| 2021/0175869 A1 | 6/2021 | Taipale |
| 2021/0200316 A1 | 7/2021 | Das et al. |
| 2021/0325967 A1 | 10/2021 | Khenkin et al. |
| 2021/0328535 A1 | 10/2021 | Khenkin et al. |
| 2021/0365118 A1 | 11/2021 | Rajapurkar et al. |
| 2022/0026989 A1 | 1/2022 | Rao et al. |
| 2022/0328752 A1 | 10/2022 | Lesso et al. |
| 2022/0404398 A1 | 12/2022 | Reynaga et al. |
| 2022/0408181 A1 | 12/2022 | Hendrix et al. |

FOREIGN PATENT DOCUMENTS

| | | | |
|---|---|---|---|
| CN | 104811838 A | 7/2015 | |
| CN | 204903757 U | 12/2015 | |
| CN | 105264551 A | 1/2016 | |
| CN | 106438890 A | 2/2017 | |
| CN | 103403796 A | 7/2017 | |
| CN | 106950832 A | 7/2017 | |
| CN | 107665051 A | 2/2018 | |
| CN | 107835968 A | 3/2018 | |
| CN | 210628147 U | 5/2020 | |
| CN | 113268138 A * | 8/2021 | ............ G05D 19/02 |
| CN | 114237414 A | 3/2022 | |
| EP | 0784844 B1 | 6/2005 | |
| EP | 2306269 A | 4/2011 | |
| EP | 2363785 A1 | 9/2011 | |
| EP | 2487780 A1 | 8/2012 | |
| EP | 2600225 A1 | 6/2013 | |
| EP | 2846218 A1 | 3/2015 | |
| EP | 2846229 A2 | 3/2015 | |
| EP | 2846329 A1 | 3/2015 | |
| EP | 2988528 A1 | 2/2016 | |
| EP | 3125508 A1 | 2/2017 | |
| EP | 3379382 A1 | 9/2018 | |
| GB | 201620746 A | 1/2017 | |
| IN | 201747044027 | 8/2018 | |
| JP | H02130433 B2 | 5/1990 | |
| JP | 08149006 A | 6/1996 | |
| JP | H10184782 A | 7/1998 | |
| JP | 6026751 B2 | 11/2016 | |
| JP | 6250985 | 12/2017 | |
| JP | 6321351 | 5/2018 | |
| KR | 20120126446 A | 11/2012 | |
| WO | 2013104919 A1 | 7/2013 | |
| WO | 2013186845 A1 | 12/2013 | |
| WO | 2014018086 A1 | 1/2014 | |
| WO | 2014094283 A1 | 6/2014 | |
| WO | 2016105496 A1 | 6/2016 | |
| WO | 2016164193 A1 | 10/2016 | |
| WO | 2017034973 A1 | 3/2017 | |
| WO | 2017113651 A1 | 7/2017 | |
| WO | WO-2017113652 A1 * | 7/2017 | ............ G05D 19/02 |
| WO | 2018053159 A1 | 3/2018 | |
| WO | 2018067613 A1 | 4/2018 | |
| WO | 2018125347 A1 | 7/2018 | |
| WO | 2020004840 A1 | 1/2020 | |
| WO | 2020055405 A1 | 3/2020 | |

OTHER PUBLICATIONS

International Search Report and Written Opinion of the International Searching Authority, International Application No. PCT/GB2019/050770, dated Jul. 5, 2019.

Communication Relating to the Results of the Partial International Search, and Provisional Opinion Accompanying the Partial Search Result, of the International Searching Authority, International Application No. PCT/US2018/031329, dated Jul. 20, 2018.

Combined Search and Examination Report, UKIPO, Application No. GB1720424.9, dated Jun. 5, 2018.

International Search Report and Written Opinion of the International Searching Authority, International Application No. PCT/GB2019/052991, dated Mar. 17, 2020, received by Applicant Mar. 19, 2020.

Communication Relating to the Results of the Partial International Search, and Provisional Opinion Accompanying the Partial Search Result, of the International Searching Authority, International Application No. PCT/GB2020/050822, dated Jul. 9, 2020.

International Search Report and Written Opinion of the International Searching Authority, International Application No. PCT/US2020/024864, dated Jul. 6, 2020.

International Search Report and Written Opinion of the International Searching Authority, International Application No. PCT/GB2020/051035, dated Jul. 10, 2020.

International Search Report and Written Opinion of the International Searching Authority, International Application No. PCT/GB2020/050823, dated Jun. 30, 2020.

International Search Report and Written Opinion of the International Searching Authority, International Application No. PCT/GB2020/051037, dated Jul. 9, 2020.

International Search Report and Written Opinion of the International Searching Authority, International Application No. PCT/GB2020/050822, dated Aug. 31, 2020.

International Search Report and Written Opinion of the International Searching Authority, International Application No. PCT/GB2020/051438, dated Sep. 28, 2020.

First Examination Opinion Notice, State Intellectual Property Office of the People's Republic of China, Application No. 201880037435.X, dated Dec. 31, 2020.

International Search Report and Written Opinion of the International Searching Authority, International Application No. PCT/US2020/056610, dated Jan. 21, 2021.

Second Office Action, National Intellectual Property Administration, PRC, Application No. 2019800208570, dated Jan. 19, 2022.

Examination Report under Section 18(3), UKIPO, Application No. GB2106247.6, dated Mar. 31, 2022.

Examination Report under Section 18(3), UKIPO, Application No. GB2112207.2, dated Aug. 18, 2022.

International Search Report and Written Opinion of the International Searching Authority, International Application No. PCT/US2022/030541, dated Sep. 1, 2022.

Vanderborght, B. et al., Variable impedance actuators: A review; Robotics and Autonomous Systems 61, Aug. 6, 2013, pp. 1601-1614.

(56) References Cited

OTHER PUBLICATIONS

International Search Report and Written Opinion of the International Searching Authority, International Application No. PCT/US2022/033190, dated Sep. 8, 2022.
International Search Report and Written Opinion of the International Searching Authority, International Application No. PCT/US2022/033230, dated Sep. 15, 2022.
Examination Report under Section 18(3), UKIPO, Application No. GB2115048.7 dated Aug. 24, 2022.
Communication Pursuant to Article 94(3) EPC, European Patent Office, Application No. 18727512.8, dated Sep. 26, 2022.
Examination Report under Section 18(3), UKIPO, Application No. GB2112207.2, dated Nov. 7, 2022.
Invitation to Pay Additional Fees, Partial International Search Report and Provisional Opinion of the International Searching Authority, International Application No. PCT/US2020/052537, dated Jan. 14, 2021.
International Search Report and Written Opinion of the International Searching Authority, International Application No. PCT/GB2020/052537, dated Mar. 9, 2021.
Office Action of the Intellectual Property Office, ROC (Taiwan) Patent Application No. 107115475, dated Apr. 30, 2021.
First Office Action, China National Intellectual Property Administration, Patent Application No. 2019800208570, dated Jun. 3, 2021.
International Search Report and Written Opinion of the International Searching Authority, International Application No. PCT/US2021/021908, dated Jun. 9, 2021.
Notice of Preliminary Rejection, Korean Intellectual Property Office, Application No. 10-2019-7036236, dated Jun. 29, 2021.
Combined Search and Examination Report, United Kingdom Intellectual Property Office, Application No. GB2018051.9, dated Jun. 30, 2021.
Communication pursuant to Rule 164(2)(b) and Article 94(3) EPC, European Patent Office, Application No. 18727512.8, dated Jul. 8, 2021.
Gottfried Behler: "Measuring the Loudspeaker's Impedance during Operation for the Derivation of the Voice Coil femperature", AES Convention Preprint, Feb. 25, 1995 (Feb. 25, 1995), Paris.
First Office Action, China National Intellectual Property Administration, Patent Application No. 2019800211287, dated Jul. 5, 2021.
Steinbach et al., Haptic Data Compression and Communication, IEEE Signal Processing Magazine, Jan. 2011.
Pezent et al., Syntacts Open-Source Software and Hardware for Audio-Controlled Haptics, IEEE Transactions on Haptics, vol. 14, No. 1, Jan.-Mar. 2021.
Examination Report under Section 18(3), United Kingdom Intellectual Property Office, Application No. GB2018051.9, dated Nov. 5, 2021.
Jaijongrak et al., A Haptic and Auditory Assistive User Interface: Helping the Blinds on their Computer Operations, 2011 IEEE International Conference on Rehabilitation Robotics, Rehab Week Zurich, ETH Zurich Science City, Switzerland, Jun. 29, 2011-Jul. 1, 2011.
Lim et al., An Audio-Haptic Feedbacks for Enhancing User Experience in Mobile Devices, 2013 IEEE International Conference on Consumer Electronics (ICCE).
Weddle et al., How Does Audio-Haptic Enhancement Influence Emotional Response to Mobile Media, 2013 Fifth International Workshop on Quality of Multimedia Experience (QoMEX), QMEX 2013.
Danieau et al., Enhancing Audiovisual Experience with Haptic Feedback: A Survey on HAV, IEEE Transactions on Haptics, vol. 6, No. 2, Apr.-Jun. 2013.
Danieau et al., Toward Haptic Cinematography: Enhancing Movie Experiences with Camera-Based Haptic Effects, IEEE Computer Society, IEEE MultiMedia, Apr.-Jun. 2014.
Final Notice of Preliminary Rejection, Korean Patent Office, Application No. 10-2019-7036236, dated Nov. 29, 2021.
Examination Report under Section 18(3), United Kingdom Intellectual Property Office, Application No. GB2018050.1, dated Dec. 22, 2021.
Examination Report, Intellectual Property India, Application No. 202117019138, dated Jan. 4, 2023.
Search Report, China National Intellectual Property Administration, Application No. 2019107179621, dated Jan. 11, 2023.
First Office Action, China National Intellectual Property Administration, Application No. 2019107179621, dated Jan. 19, 2023.
Examination Report under Section 18(3), UKIPO, Application No. GB2113228.7, dated Feb. 10, 2023.
Examination Report under Section 18(3), UKIPO, Application No. GB2113154.5, dated Feb. 17, 2023.
Combined Search and Examination Report under Sections 17 and 18(3), UKIPO, Application No. GB2210174.5, dated Aug. 1, 2022.
Examination Report under Section 18(3), UKIPO, Application No. GB2117488.3, dated Apr. 27, 2023.
Second Office Action, National Intellectual Property Administration, PRC, Application No. 2019107179621, dated May 24, 2023.
Examination Report under Section 18(3), UKIPO, Application No. GB2113228.7, dated Jun. 28, 2023.

* cited by examiner

| MODE SWITCH OUTPUT CLASSIFICATION ||
| --- | --- |
| ATTEN | OUTPUT CLASSIFICATION |
| 0 | OPEN LOOP |
| >0, <1 | PARTIALLY CLOSED LOOP |
| 1 | CLOSED LOOP |

METHODS AND SYSTEMS FOR MANAGING MIXED MODE ELECTROMECHANICAL ACTUATOR DRIVE

RELATED APPLICATION

The present disclosure claims priority to U.S. Provisional Patent Application No. 63/213,612 filed Jun. 22, 2021, which is incorporated by reference in its entirety herein.

The present disclosure cross-references U.S. Pat. No. 10,828,672 entitled "Driver Circuitry" to Stahl et al. and assigned to Cirrus Logic, Inc. (hereafter referred to as the "Stahl patent"), U.S. Patent Publication No. 2021/0175869 entitled "Methods and Systems for Detecting and Managing Amplifier Instability" to Taipale (hereafter referred to as the "Taipale patent application"), and U.S. Patent Publication No. 2021/0174777 entitled "Methods and Systems for Estimating Coil Impedance of an Electromagnetic Transducer" to Marchais et al. (hereafter referred to as the "Marchais patent application"). The Stahl patent, the Taipale patent application, and the Marchais patent application are all incorporated by reference in their entirety herein.

FIELD OF DISCLOSURE

The present disclosure relates in general to use of an amplifier to drive a haptic vibrational load in both open loop and closed loop operating modes, and the management of signals sent to the amplifier when switching between these two operating modes.

BACKGROUND

Vibro-haptic transducers, for example electromechanical actuators such as linear resonant actuators (LRAs), are widely used in portable devices such as mobile phones to generate vibrational feedback to a user. Vibro-haptic feedback in various forms creates different feelings of touch to a user's skin, and may play increasing roles in human-machine interactions for modern devices.

An LRA may be modelled as a mass-spring electromechanical vibration system. When driven with appropriately designed or controlled driving signals, an LRA may generate certain desired forms of vibrations. For example, a sharp and clear-cut vibration pattern on a user's finger may be used to create a sensation that mimics a mechanical button click. This clear-cut vibration may then be used as a virtual switch to replace mechanical buttons.

FIG. 1 illustrates an example of a vibro-haptic system in a device 100. Device 100 may comprise a controller 101 configured to control a signal applied to an amplifier 102. Amplifier 102 may then drive a haptic transducer 103 based on the signal. Controller 101 may be triggered by a trigger to output to the signal. The trigger may for example comprise a pressure or force sensor on a screen or virtual button of device 100.

Among the various forms of vibro-haptic feedback, tonal vibrations of sustained duration may play an important role to notify the user of the device of certain predefined events, such as incoming calls or messages, emergency alerts, and timer warnings, etc. In order to generate tonal vibration notifications efficiently, it may be desirable to operate the haptic actuator at its resonance frequency.

The resonance frequency $f_0$ of a haptic transducer may be approximately estimated as:

$$f_0 = \frac{1}{2 * \pi * \sqrt{C * M}} \quad (1)$$

where C is the compliance of the spring system, and M is the equivalent moving mass, which may be determined based on both the actual moving part in the haptic transducer and the mass of the portable device holding the haptic transducer.

Due to sample-to-sample variations in individual haptic transducers, mobile device assembly variations, temporal component changes caused by aging, component changes caused by self-heating, and use conditions such as various different strengths of a user gripping of the device, the vibration resonance of the haptic transducer may vary from time to time.

FIG. 2A illustrates an example of a linear resonant actuator (LRA) modelled as a linear system including a mass-spring system 201. LRAs are non-linear components that may behave differently depending on, for example, the voltage levels applied, the operating temperature, and the frequency of operation. However, these components may be modelled as linear components within certain conditions.

FIG. 2B illustrates an example of an LRA modelled as a linear system, including an electrically equivalent model of mass-spring system 201 of LRA. In this example, the LRA is modelled as a third order system having electrical and mechanical elements. In particular, Re and Le are the DC resistance and coil inductance of the coil-magnet system, respectively; and Bl is the magnetic force factor of the coil. The driving amplifier outputs the voltage waveform V(t) with the output impedance $R_O$. The terminal voltage $V_T(t)$ may be sensed across the terminals of the haptic transducer. The mass-spring system 201 moves with velocity u(t), which may be proportional to back-electromotive force $V_{BEMF}$.

An electromagnetic load such as an LRA may be characterized by its impedance $Z_{LRA}$ as seen as the sum of a coil impedance $Z_{coil}$ and a mechanical impedance $Z_{mech}$:

$$Z_{LRA} = Z_{coil} + Z_{mech} \quad (2)$$

Coil impedance $Z_{coil}$ may in turn comprise a direct current (DC) resistance Re in series with an inductance Le:

$$Z_{coil} = Re + s*Le \quad (3)$$

Mechanical impedance $Z_{mech}$ may be defined by three parameters including the resistance at resonance $R_{RES}$ representing an electrical resistance representative of mechanical friction of the mass-spring system of the haptic transducer, a capacitance $C_{MES}$ representing an electrical capacitance representative of an equivalent moving mass M of the mass-spring system of the haptic transducer, and inductance $L_{CES}$ representative of a compliance C of the mass-spring system of the haptic transducer. The electrical equivalent of the total mechanical impedance is the parallel connection of $R_{RES}$, $C_{MES}$, $L_{CES}$. The Laplace transform of this parallel connection is described by:

$$Z_{mech}(s) = \frac{1}{\left(\frac{1}{R_{RES}} + \frac{1}{L_{CES}*s} + C_{MES}*s\right)} \quad (4)$$

The resonant frequency $f_0$ of the haptic transducer can be represented as:

$$f_0 = \frac{1}{(2 * \pi * \sqrt{L_{CES} * C_{MES}} *)} \quad (5)$$

The quality factor Q of the LRA can be represented as:

$$Q = \frac{R_{RES} * Re}{R_{RES} + Re} * \sqrt{\frac{C_{MES}}{L_{CES}}} \quad (6)$$

Referring to equation (6), it may appear non-intuitive that the expression involves a subexpression describing the parallel connection of resistances Re and $R_{RES}$ $$\left(\text{i.e., } \frac{R_{RES} * Re}{R_{RES} + Re}\right)$$

while in FIG. 2B these resistances are shown in a series connection. However, such may be the case where a driving voltage Ve is oscillating but then abruptly turns off and goes to zero. The voltage amplifier shown in FIG. 2B may be considered to have a low source impedance, ideally zero source impedance. Under these conditions, when driving voltage Ve goes to zero, the voltage amplifier effectively disappears from the circuit. At that point, the top-most terminal of resistance Re in FIG. 2B is grounded, as is the bottom-most terminal of resistance $R_{RES}$, and so resistances Re and $R_{RES}$ are indeed connected in parallel as reflected in equation (6).

Electromagnetic transducers, such as LRAs or microspeakers, may have slow response times. FIG. 3 is a graph of an example response of an LRA, depicting an example driving signal to the LRA, a current through the LRA, and a back electromotive force (back EMF) of the LRA, wherein such back EMF may be proportional to the velocity of a moving element (e.g., coil or magnet) of the transducer. As shown in FIG. 3, the attack time of the back EMF may be slow as energy is transferred to the LRA, and some "ringing" of the back EMF may occur after the driving signal has ended as the mechanical energy stored in the LRA is discharged. In the context of a haptic LRA, such behavioral characteristic may result in a "mushy" feeling click or pulse, instead of a "crisp" tactile response. Thus, it may be desirable for an LRA to instead have a response similar to that shown in FIG. 4, in which there exists minimal ringing after the driving signal has ended, and which may provide a more "crisp" tactile response in a haptic context. Accordingly, it may be desirable to apply processing to a driving signal such that when the processed driving signal is applied to the transducer, the velocity or back EMF of the transducer more closely approaches that of FIG. 4.

SUMMARY

In accordance with the teachings of the present disclosure, the disadvantages and problems associated with gracefully switching the driving modes of an amplifier when coupled to an electromechanical load between open loop and negative impedance closed loop modes may be reduced or eliminated.

In accordance with embodiments of the present disclosure, a method of driving a playback waveform to an electromagnetic actuator by a transducer driving system may include operating the transducer driving system in a first mode wherein the electromagnetic actuator is driven with the playback waveform in a closed loop to form a closed-loop voltage drive system that includes a negative impedance, operating the transducer driving system in a second mode wherein the electromechanical actuator is driven with the playback waveform in an open loop, and operating a mode switch for transitioning the transducer driving system to operate between the first mode and the second mode.

In accordance with these and other embodiments of the present disclosure, a transducer driving system for driving a playback waveform to an electromagnetic actuator may include an output for generating the playback waveform and a control subsystem configured to operate the transducer driving system in a first mode wherein the electromagnetic actuator is driven with the playback waveform in a closed loop to form a closed-loop voltage drive system that includes a negative impedance, operate the transducer driving system in a second mode wherein the electromechanical actuator is driven with the playback waveform in an open loop, and operate a mode switch for transitioning the transducer driving system to operate between the first mode and the second mode.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiment discussed below, and all such equivalents should be deemed as being encompassed by the present disclosure.

Various electronic devices or smart devices may have transducers, speakers, and acoustic output transducers, for example any transducer for converting a suitable electrical driving signal into an acoustic output such as a sonic pressure wave or mechanical vibration. For example, many electronic devices may include one or more speakers or loudspeakers for sound generation, for example, for playback of audio content, voice communications and/or for providing audible notifications.

Such speakers or loudspeakers may comprise an electromagnetic actuator, for example a voice coil motor, which is mechanically coupled to a flexible diaphragm, for example a conventional loudspeaker cone, or which is mechanically coupled to a surface of a device, for example the glass screen of a mobile device. Some electronic devices may also include acoustic output transducers capable of generating ultrasonic waves, for example for use in proximity detection type applications and/or machine-to-machine communication.

Many electronic devices may additionally or alternatively include more specialized acoustic output transducers, for example, haptic transducers, tailored for generating vibrations for haptic control feedback or notifications to a user. Additionally, or alternatively, an electronic device may have a connector, e.g., a socket, for making a removable mating connection with a corresponding connector of an accessory apparatus, and may be arranged to provide a driving signal to the connector so as to drive a transducer, of one or more of the types mentioned above, of the accessory apparatus when connected. Such an electronic device will thus comprise driving circuitry for driving the transducer of the host device or connected accessory with a suitable driving signal. For acoustic or haptic transducers, the driving signal will generally be an analog time varying voltage signal, for example, a time varying waveform.

Figure 5:
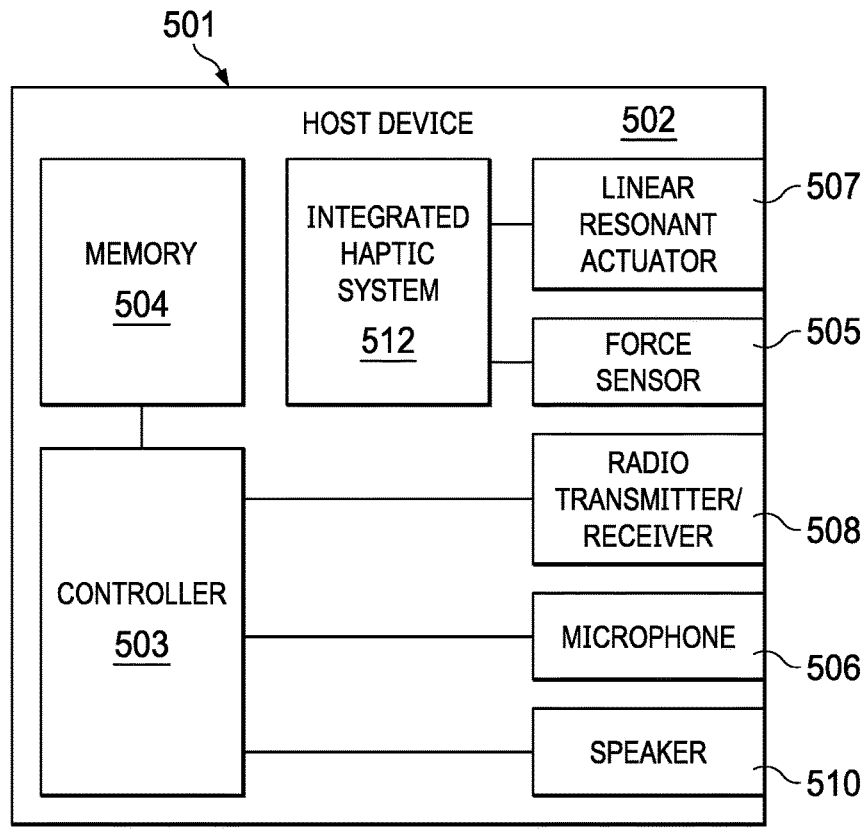
FIG. 5 illustrates a block diagram of selected components of an example mobile device, in accordance with embodiments of the present disclosure.

FIG. 5 illustrates a block diagram of selected components of an example host device 502, in accordance with embodiments of the present disclosure. As shown in FIG. 5, host device 502 may comprise an enclosure 501, a controller 503, a memory 504, a force sensor 505, a microphone 506, a linear resonant actuator 507, a radio transmitter/receiver 508, a speaker 510, and an integrated haptic system 512.

Enclosure 501 may comprise any suitable housing, casing, or other enclosure for housing the various components of host device 502. Enclosure 501 may be constructed from plastic, metal, and/or any other suitable materials. In addition, enclosure 501 may be adapted (e.g., sized and shaped) such that host device 502 is readily transported on a person of a user of host device 502. Accordingly, host device 502 may include but is not limited to a smart phone, a tablet computing device, a handheld computing device, a personal digital assistant, a notebook computer, a video game controller, or any other device that may be readily transported on a person of a user of host device 502.

Controller 503 may be housed within enclosure 501 and may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, controller 503 interprets and/or executes program instructions and/or processes data stored in memory 504 and/or other computer-readable media accessible to controller 503.

Memory 504 may be housed within enclosure 501, may be communicatively coupled to controller 503, and may include any system, device, or apparatus configured to retain program instructions and/or data for a period of time (e.g., computer-readable media). Memory 504 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to host device 502 is turned off.

Microphone 506 may be housed at least partially within enclosure 501, may be communicatively coupled to controller 503, and may comprise any system, device, or apparatus configured to convert sound incident at microphone 506 to an electrical signal that may be processed by controller 503, wherein such sound is converted to an electrical signal using a diaphragm or membrane having an electrical capacitance that varies based on sonic vibrations received at the diaphragm or membrane. Microphone 506 may include an electrostatic microphone, a condenser microphone, an electret microphone, a microelectromechanical systems (MEMS) microphone, or any other suitable capacitive microphone.

Radio transmitter/receiver 508 may be housed within enclosure 501, may be communicatively coupled to controller 503, and may include any system, device, or apparatus configured to, with the aid of an antenna, generate and transmit radio-frequency signals as well as receive radio-frequency signals and convert the information carried by such received signals into a form usable by controller 503. Radio transmitter/receiver 508 may be configured to transmit and/or receive various types of radio-frequency signals, including without limitation, cellular communications (e.g., 2G, 3G, 4G, LTE, etc.), short-range wireless communications (e.g., BLUETOOTH), commercial radio signals, television signals, satellite radio signals (e.g., GPS), Wireless Fidelity, etc.

A speaker 510 may be housed at least partially within enclosure 501 or may be external to enclosure 501, may be communicatively coupled to controller 503, and may comprise any system, device, or apparatus configured to produce sound in response to electrical audio signal input. In some embodiments, a speaker may comprise a dynamic loudspeaker, which employs a lightweight diaphragm mechanically coupled to a rigid frame via a flexible suspension that constrains a voice coil to move axially through a cylindrical magnetic gap. When an electrical signal is applied to the voice coil, a magnetic field is created by the electric current in the voice coil, making it a variable electromagnet. The coil and the driver's magnetic system interact, generating a mechanical force that causes the coil (and thus, the attached cone) to move back and forth, thereby reproducing sound under the control of the applied electrical signal coming from the amplifier.

Force sensor 505 may be housed within enclosure 501, and may include any suitable system, device, or apparatus for sensing a force, a pressure, or a touch (e.g., an interaction with a human finger) and generating an electrical or electronic signal in response to such force, pressure, or touch. In some embodiments, such electrical or electronic signal may be a function of a magnitude of the force, pressure, or touch applied to the force sensor. In these and other embodiments, such electronic or electrical signal may comprise a general purpose input/output signal (GPIO) associated with an input signal to which haptic feedback is given. Force sensor 505 may include, without limitation, a capacitive displacement sensor, an inductive force sensor (e.g., a resistive-inductive-capacitive sensor), a strain gauge, a piezoelectric force sensor, force sensing resistor, piezoelectric force sensor, thin film force sensor, or a quantum tunneling composite-based force sensor. For purposes of clarity and exposition in this disclosure, the term "force" as used herein may refer not only to force, but to physical quantities indicative of force or analogous to force, such as, but not limited to, pressure and touch.

Linear resonant actuator 507 may be housed within enclosure 501, and may include any suitable system, device, or apparatus for producing an oscillating mechanical force across a single axis. For example, in some embodiments, linear resonant actuator 507 may rely on an alternating current voltage to drive a voice coil pressed against a moving mass connected to a spring. When the voice coil is driven at the resonant frequency of the spring, linear resonant actuator 507 may vibrate with a perceptible force. Thus, linear resonant actuator 507 may be useful in haptic applications within a specific frequency range. While, for the purposes of clarity and exposition, this disclosure is described in relation to the use of linear resonant actuator 507, it is understood that any other type or types of vibrational actuators (e.g., eccentric rotating mass actuators) may be used in lieu of or in addition to linear resonant actuator 507. In addition, it is also understood that actuators arranged to produce an oscillating mechanical force across multiple axes may be used in lieu of or in addition to linear resonant actuator 507. As described elsewhere in this disclosure, a linear resonant actuator 507, based on a signal received from integrated haptic system 512, may render haptic feedback to a user of host device 502 for at least one of mechanical button replacement and capacitive sensor feedback.

Integrated haptic system 512 may be housed within enclosure 501, may be communicatively coupled to force sensor 505 and linear resonant actuator 507, and may include any system, device, or apparatus configured to receive a signal from force sensor 505 indicative of a force applied to host device 502 (e.g., a force applied by a human finger to a virtual button of host device 502) and generate an electronic signal for driving linear resonant actuator 507 in response to the force applied to host device 502. Detail of an example integrated haptic system in accordance with embodiments of the present disclosure is depicted in FIG. 6.

Although specific example components are depicted above in FIG. 5 as being integral to host device 502 (e.g., controller 503, memory 504, force sensor 505, microphone 506, radio transmitter/receiver 508, speakers(s) 510), a host device 502 in accordance with this disclosure may comprise one or more components not specifically enumerated above. For example, although FIG. 5 depicts certain user interface components, host device 502 may include one or more other user interface components in addition to those depicted in FIG. 5 (including but not limited to a keypad, a touch screen, and a display), thus allowing a user to interact with and/or otherwise manipulate host device 502 and its associated components.

Figure 6:
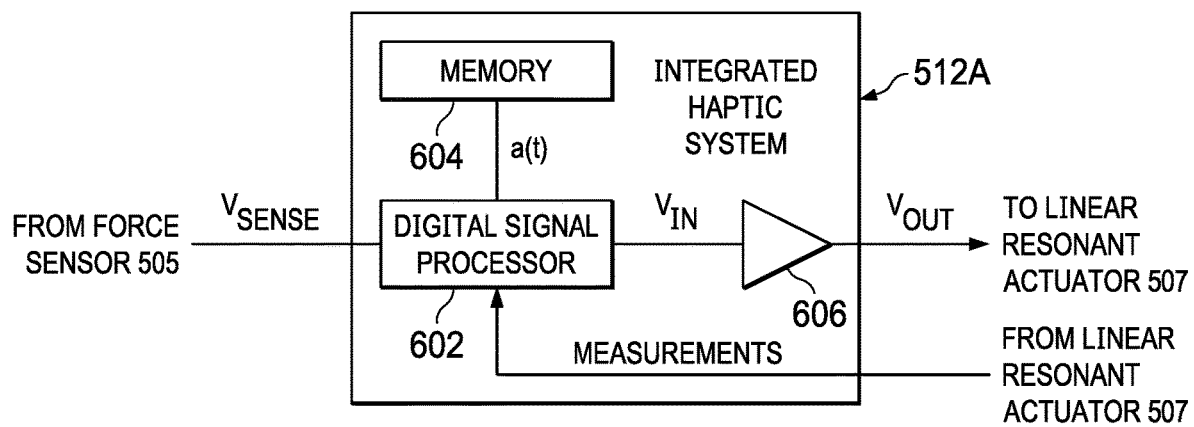
FIG. 6 illustrates a block diagram of selected components of an example integrated haptic system, in accordance with embodiments of the present disclosure.

FIG. 6 illustrates a block diagram of selected components of an example integrated haptic system 512A, in accordance with embodiments of the present disclosure. In some embodiments, integrated haptic system 512A may be used to implement integrated haptic system 512 of FIG. 5. As shown in FIG. 6, integrated haptic system 512A may include a digital signal processor (DSP) 602, a memory 604, and an amplifier 606.

DSP 602 may include any system, device, or apparatus configured to interpret and/or execute program instructions and/or process data. In some embodiments, DSP 602 may interpret and/or execute program instructions and/or process data stored in memory 604 and/or other computer-readable media accessible to DSP 602.

Memory 604 may be communicatively coupled to DSP 602, and may include any system, device, or apparatus configured to retain program instructions and/or data for a period of time (e.g., computer-readable media). Memory 604 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to host device 502 is turned off.

Amplifier 606 may be electrically coupled to DSP 602 and may comprise any suitable electronic system, device, or apparatus configured to increase the power of an input signal $V_{IN}$ (e.g., a time-varying voltage or current) to generate an output signal $V_{OUT}$. For example, amplifier 606 may use electric power from a power supply (not explicitly shown) to increase the amplitude of a signal. Amplifier 606 may include any suitable amplifier class, including without limitation, a Class-D amplifier.

In operation, memory 604 may store one or more haptic playback waveforms. In some embodiments, each of the one or more haptic playback waveforms may define a haptic response a(t) as a desired acceleration of a linear resonant actuator (e.g., linear resonant actuator 507) as a function of time. DSP 602 may be configured to receive a force signal $V_{SENSE}$ indicative of force applied to force sensor 505. Either in response to receipt of force signal $V_{SENSE}$ indicating a sensed force or independently of such receipt, DSP 602 may retrieve a haptic playback waveform from memory 604 and process such haptic playback waveform to determine a processed haptic playback signal $V_{IN}$. In embodiments in which amplifier 606 is a Class D amplifier, processed haptic playback signal $V_{IN}$ may comprise a pulse-width modulated signal. In response to receipt of force signal $V_{SENSE}$ indicating a sensed force, DSP 602 may cause processed haptic playback signal $V_{IN}$ to be output to amplifier 606, and amplifier 606 may amplify processed haptic playback signal $V_{IN}$ to generate a haptic output signal $V_{OUT}$ for driving linear resonant actuator 507.

In some embodiments, integrated haptic system 512A may be formed on a single integrated circuit, thus enabling lower latency than existing approaches to haptic feedback control. By providing integrated haptic system 512A as part of a single monolithic integrated circuit, latencies between various interfaces and system components of integrated haptic system 512A may be reduced or eliminated.

Figure 1:
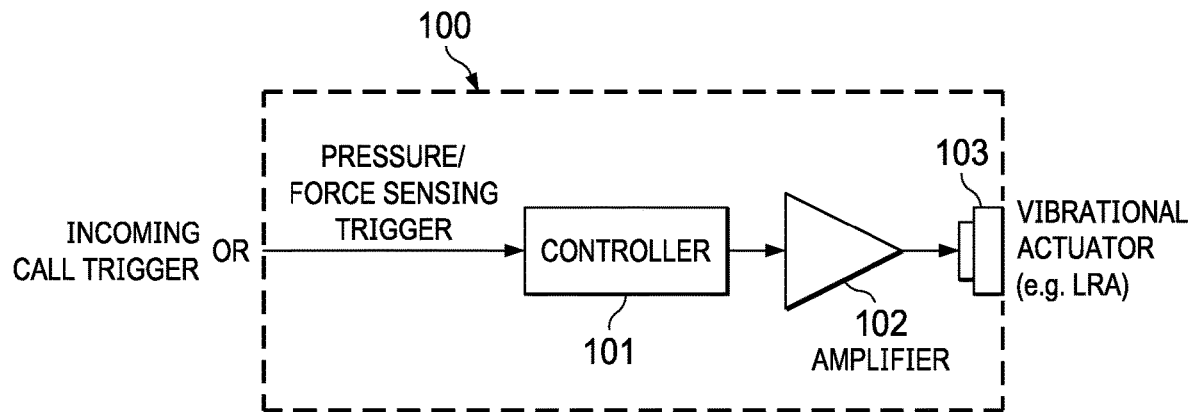
FIG. 1 illustrates an example of a vibro-haptic system in a device, as is known in the art.
Figure 2A:
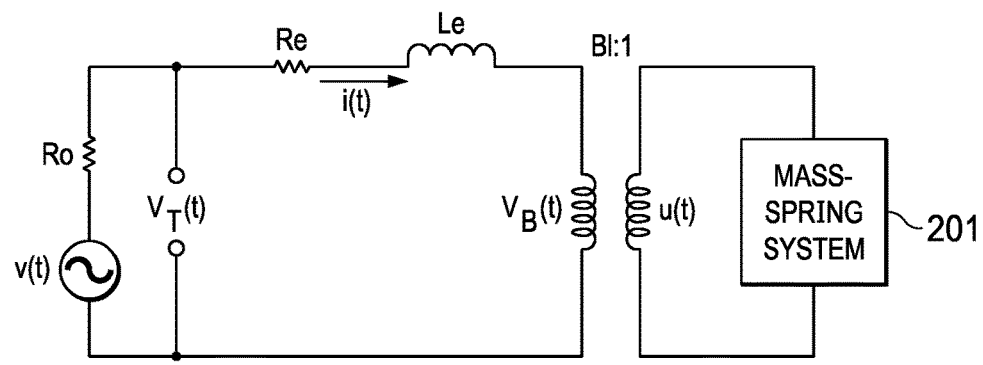
FIGS. 2A and 2B each illustrate an example of a Linear Resonant Actuator (LRA) modelled as a linear system, as is known in the art.
Figure 2B:
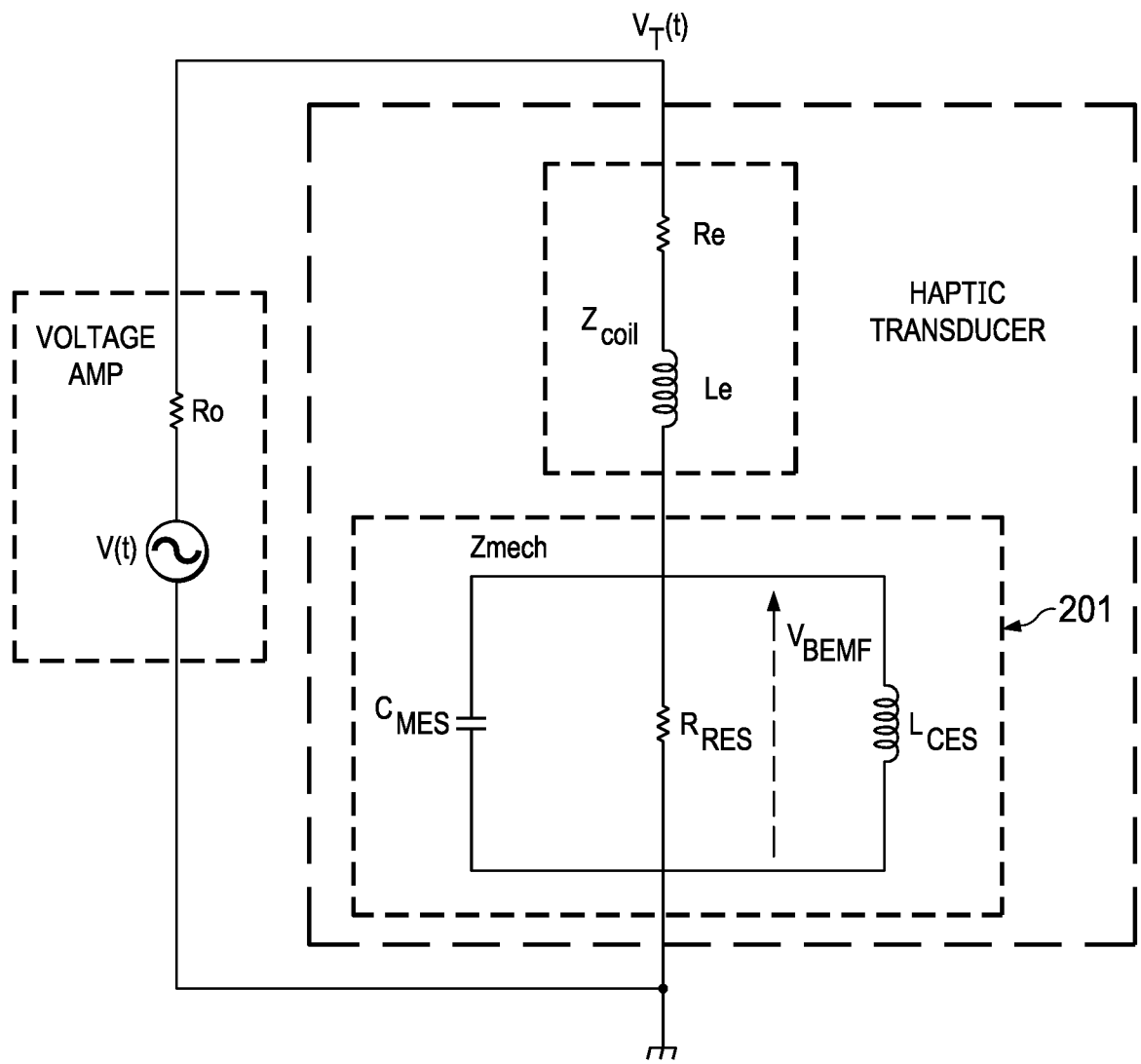
Figure 3:
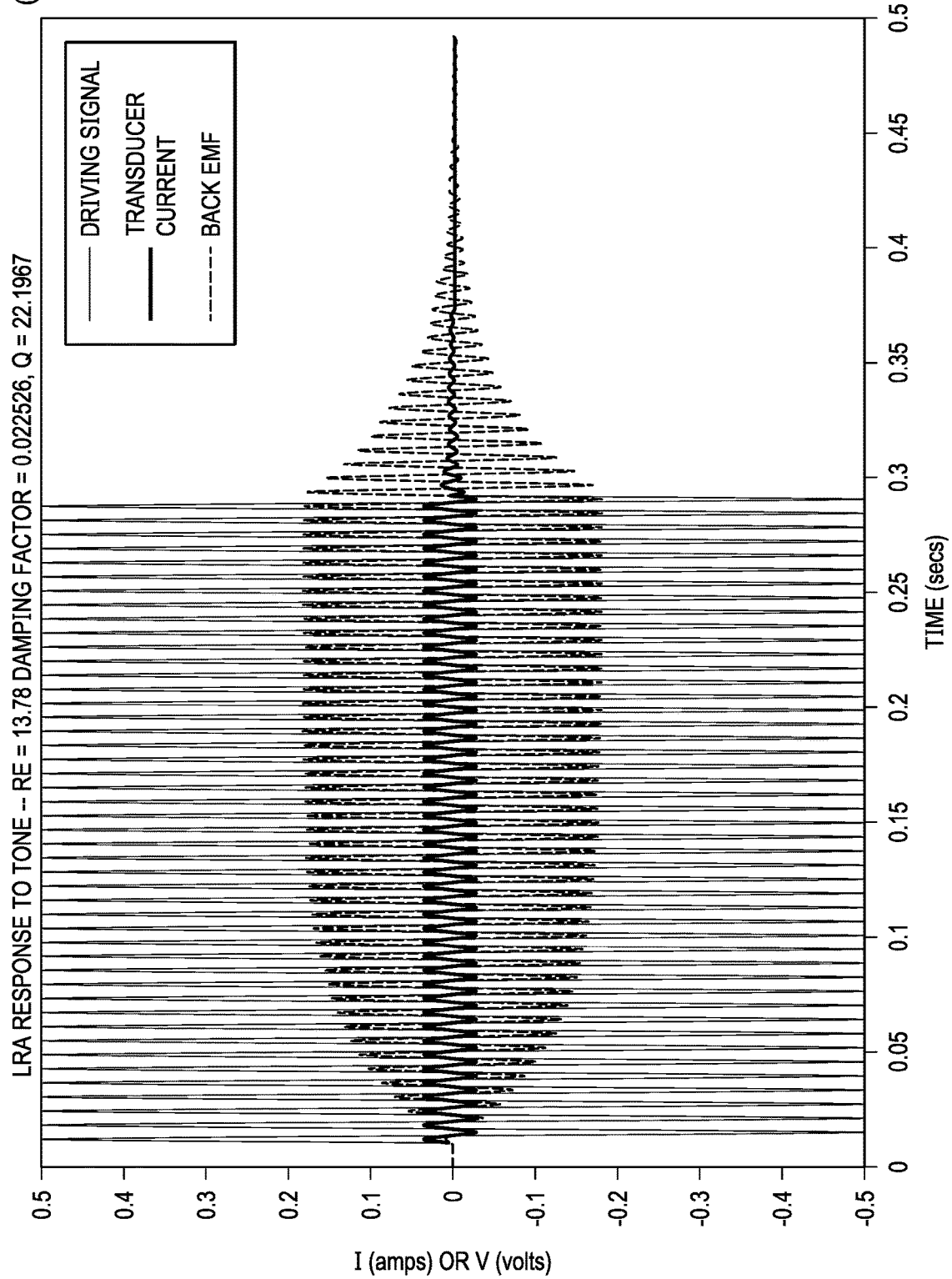
FIG. 3 illustrates a graph of example waveforms of an electromagnetic load, as is known in the art.
Figure 4:
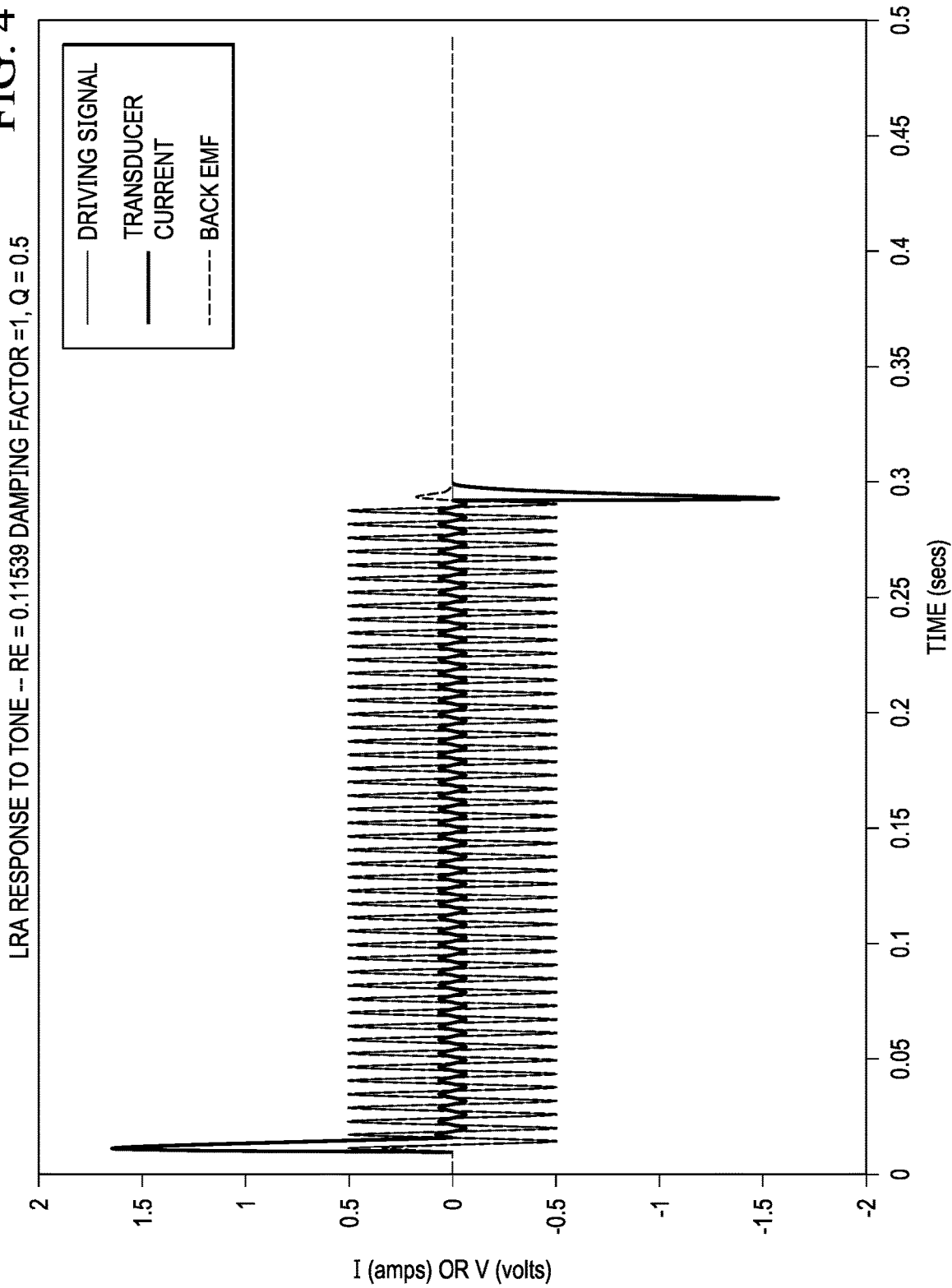
FIG. 4 illustrates a graph of desirable example waveforms of an electromagnetic load, in accordance with embodiments of the present disclosure.

The problem illustrated in FIG. 3 may result from a linear resonant actuator 507 with a high quality factor q with a sharp peak in impedance/resistance at a resonant frequency $f_0$ of linear resonant actuator 507.

Figure 7:
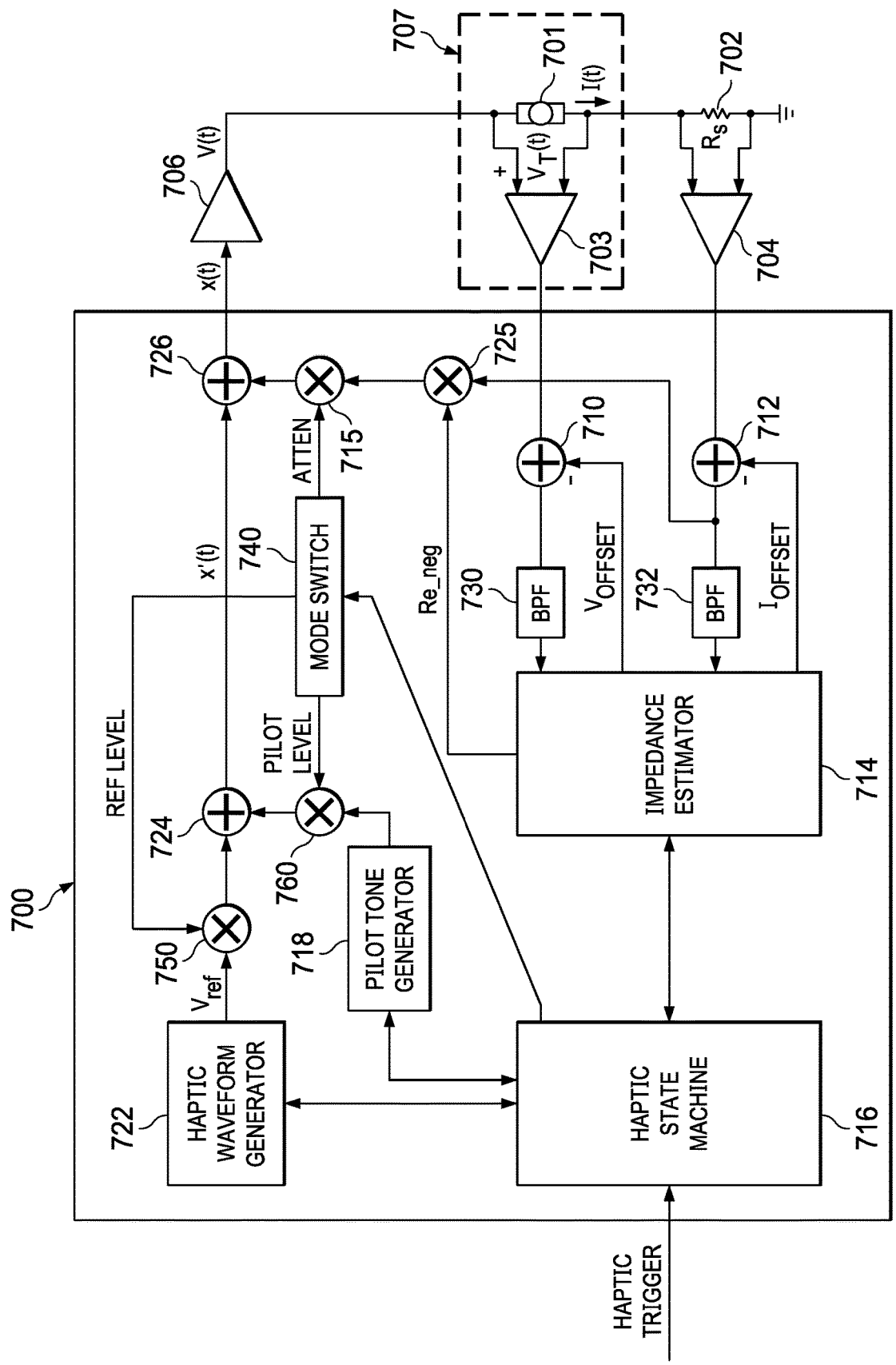
FIG. 7 illustrates an example transducer driving system for improving transducer dynamics when switching operating modes between open loop and negative impedance closed loop, in accordance with embodiments of the present disclosure.

FIG. 7 illustrates an example transducer driving system 700 for improving dynamics of an electromagnetic load 701, in accordance with embodiments of the present disclosure. In some embodiments, system 700 may be integral to a host device (e.g., host device 502) comprising system 700 and electromagnetic load 701.

In operation, a haptic waveform generator 722 of a system 700 of a host device may generate a haptic playback waveform $V_{ref}(t)$ which, in the absence of a pilot tone generated by pilot tone generator 718, may be equivalent to a raw transducer driving signal x'(t) comprising a haptic waveform signal or audio signal. In some embodiments, raw transducer driving signal x' (t) may be generated based on stored haptic waveforms and/or dynamically-generated haptic waveforms stored by haptic waveform generator 722 or in a memory (e.g., memory 604) accessible to haptic waveform generator 722.

Raw transducer driving signal x'(t) may be received by combiner 726 which may combine raw transducer driving signal x'(t) with a correction term from multiplier 715 to generate transducer driving signal x (t) in order to effectively cancel some or all of a coil impedance/resistance of electromagnetic load 701, as described in greater detail below. Also as described below, by effectively reducing the coil impedance/resistance of electromagnetic load 701, system 700 may also reduce an effective quality factor q of electromagnetic load 701, which may in turn decrease attack time and minimize ringing occurring after the raw transducer driving signal has ended. Although FIG. 7 depicts a virtual negative impedance/resistance being applied by way of a combiner 726, in some embodiments a negative impedance/resistance filter may be applied to raw transducer driving signal x'(t) to generate transducer driving signal x(t) to achieve the same or a similar effect of effectively reducing coil impedance/resistance of electromagnetic load 701. An example of such a negative impedance/resistance filter is described in U.S. Patent Publication No. 2020/0306796 entitled "Methods and Systems for Improving Transducer Dynamics" to Lindemann et al. and is assigned to Cirrus Logic International Semiconductor Ltd. (hereafter referred to as the "Lindemann patent application") and is incorporated by reference herein in its entirety.

Transducer driving signal x(t) may in turn be amplified by amplifier 706 to generate a driving signal V(t) for driving electromagnetic load 701. Responsive to driving signal V (t), a sensed terminal voltage $V_T(t)$ of electromagnetic load 701 may be converted to a digital representation by a first analog-to-digital converter (ADC) 703. Similarly, sensed current I(t) may be converted to a digital representation by a second ADC 704. Current I(t) may be sensed across a shunt resistor 702 having resistance $R_s$ coupled to a terminal of electromagnetic load 701. The terminal voltage $V_T(t)$ may be sensed by a terminal voltage sensing block 707, for example a voltmeter.

As shown in FIG. 7, system 700 may include an impedance estimator 714. Impedance estimator 714 may include any suitable system, device, or apparatus configured to estimate, based on sensed terminal voltage $V_T(t)$, sensed current I(t), and/or any other measured parameters of electromagnetic load 701, one or more components of the electrical and/or mechanical impedances/resistances of electromagnetic load 701, and generate one or more control signals. For example, one control signal generated by impedance estimator 714 may include a negative impedance/resistance Re_neg generated based on an estimate of direct-current (DC) coil impedance/resistance Re of electromagnetic load 701. As another example, impedance estimator 714 may also generate a voltage offset $V_{OFFSET}$ and a current offset $I_{OFFSET}$, which may be subtracted from sensed terminal voltage $V_T(t)$ and sensed current I(t), respectively, by combiners 710 and 712, respectively, to cancel any measurement offsets that may be present and detected by impedance estimator 714. As a further example, and as described in greater detail below, impedance estimator 714 may generate one or more control signals for communication to haptic state machine 716. In some embodiments, haptic state machine 716 may operate in a manner identical or similar to that described in the Marchais patent application.

Also shown in FIG. 7 are two bandpass filters (BPF) 730 and 732, respectively, filtering the offset-cancelled versions of the sensed terminal voltage $V_T(t)$ and sensed current I(t). Bandpass filters 730 and 732 may filter out haptic playback content of driving signal V (t) from entering impedance estimator 714, and thus possibly biasing it away from an accurate estimate of DC coil impedance/resistance Re.

As also depicted in FIG. 7, a mode switch 740 may receive status indications from the haptic state machine 716 regarding which particular portion of a playback waveform is presently being output by haptic waveform generator 722, as well as an indication of the playback waveform's signal level, and also information regarding the operating mode of the playback waveform—whether it be an open-loop operating mode (e.g., no negative impedance/resistance applied)

or a closed-loop operating mode (e.g., negative impedance/resistance applied). As described in greater detail below, based on the above-described inputs, mode switch 740 may control three signal levels: (i) a level of the playback waveform (via a scalar value REF_LEVEL applied by multiplier 750); a level of the pilot signal used to aid in impedance/resistance estimation (via a scalar value PILOT_LEVEL applied by multiplier 760); and a level of a negative impedance/resistance feedback correction signal (via a scalar value ATTEN applied by multiplier 715).

Figures 8, 9:
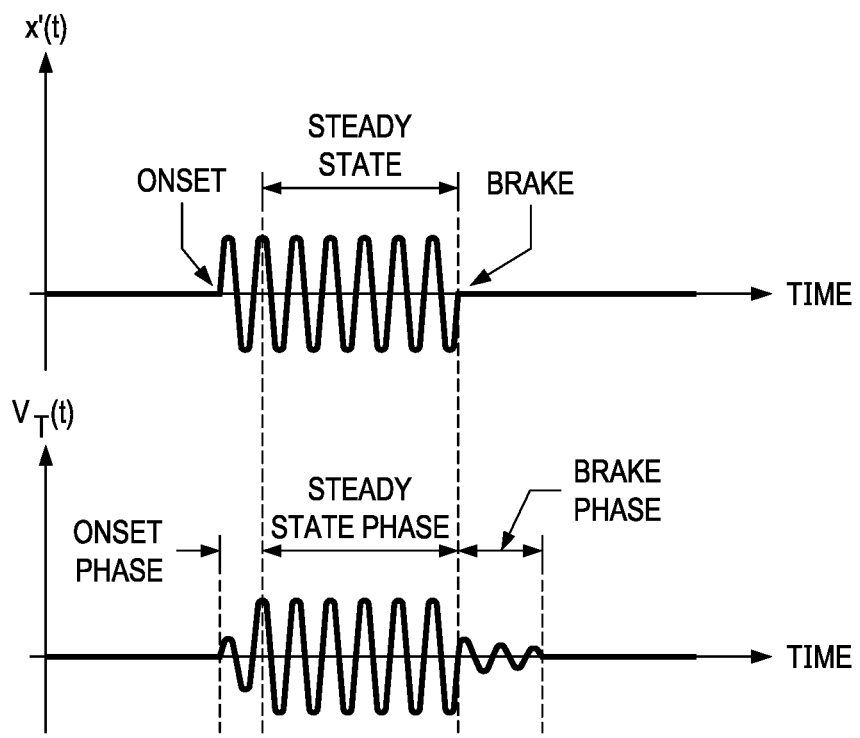
FIG. 8 illustrates a table of example classifications of operating modes of the example transducer driving system of FIG. 7 based on a value of a multiplier's input, in accordance with embodiments of the present disclosure.
FIG. 9 illustrates graphs of an example voltage driving signal and an example sensed terminal voltage for the example transducer driving system of FIG. 7 that illustrate different waveform sub-sections that are correlated to haptic terminology for a haptic event, in accordance with embodiments of the present disclosure.

FIG. 8 illustrates a table of example classifications of operating modes of example transducer driving system 700 of FIG. 7 based on a value of the scalar value ATTEN, in accordance with embodiments of the present disclosure. If the value of ATTEN is zero, no feedback correction may exist in example transducer driving system 700, and thus the negative impedance/resistance generated by multiplier 725 is effectively absent from example transducer driving system 700 as far as having any effect on the playback waveform. In this case, transducer driving system 700 may be classified as "open loop." At the other extreme, if the value of the scaler ATTEN is unity, then example transducer driving system 700 may operate as a negative impedance/resistance system, such as that described in the prior references that were earlier incorporated by reference, including but not limited to, the Stahl patent, the Taipale patent application, the Marchais patent application, and the Lindemann patent application. In this case, transducer driving system 700 may be classified as "closed loop." If the value of the scaler ATTEN assumes any value in between, but not including, zero and unity, then example transducer driving system 700 may be classified as "partially closed loop." Normally, the partially closed loop system is utilized briefly under circumstances such as, but not limited to, transition between closed loop and open loop, during the start of a haptic playback waveform whose level is too large for a closed loop system to provide enough voltage drive, or during the sudden end of a haptic playback waveform whose level is too large for a closed loop system to provide enough voltage drive.

FIG. 9 illustrates graphs of an example raw transducer driving signal x'(t) and an example sensed terminal voltage $V_T(t)$ for example transducer driving system 700 of FIG. 7 that illustrate different waveform sections that are correlated to haptic terminology for a haptic event, in accordance with embodiments of the present disclosure. Terminology may be provided to classify portions of haptic playback waveforms. The start of a waveform may be known as the onset. For closed-loop systems, the start of a waveform may also be known as the overdrive, because the closed-loop system may provide a much stronger raw transducer driving signal x'(t) in order to cause the moving mass of electromechanical load 701 to begin moving more quickly. Onset is a term, however, that may apply equally to both open loop and closed loop systems. The sudden end of the haptic playback waveform may be known as brake or braking. Electromechanical load 701, depending on a damping constant of the system, may have a ring that decays over time after brake. Often, it is the desire of haptic product manufacturers for the ringing of electromagnetic load 701 to decay quickly. The term braking implies that some additional components are present to force the decay to occur quickly. Such additional components may be those components making up the negative impedance/resistance closed-loop system (e.g., those systems disclosed in the references incorporated by reference), but such braking may not be available for purely open-loop systems. Nonetheless, the term braking is used here to refer to the portion of the playback waveform including the sudden end and a brief time thereafter to allow for the ringing of the moving mass to fully decay. In between these onset and brake portions of the haptic playback waveform, the haptic playback waveform may be considered to be in steady state as shown in FIG. 9.

To further illustrate the example classifications of operating modes of example transducer driving system 700 set forth in FIG. 8 and the example classifications of portions of a haptic playback waveform set forth in FIG. 9, examples are provided. For some playback waveforms, such as a "click," which is a very brief haptic event composed of one or at most a few cycles of a haptic playback waveform, it may be desirable to play the onset and steady-state portions of the haptic playback waveform itself in open-loop mode (ATTEN=0). The reason for playing back the onset and steady-state portions of the haptic playback waveform in open-loop mode is that a designer of the haptic event may not wish to design the waveform with a somewhat briefly unpredictable negative impedance/resistance feedback correction term during the waveform itself. That said, in order to minimize ringing decay time after the click event, the designer may wish to switch transducer driving system 700 from open-loop mode to negative impedance/resistance closed-loop mode (ATTEN=1). In such a case, the transition of the feedback correction signal from fully off (ATTEN=0) to fully on (ATTEN=1) may be accomplished via a step function, or possibly a very short ramp from one level to a next level. By so doing, the click may "play" as designed, and end more quickly than the open-loop driving amp would allow otherwise. This switching from open- to closed-loop mode may provide for "crisp" haptic effects (for example, when electromechanical load 701 is a linear resonant actuator) that serve as effective tactile feedback to indicate to a user of a device comprising electromagnetic load 701 that some input by the user (an example such as clicking on a particular letter of the alphabet while composing a text message) has been acknowledged.

As another example, the designer of the haptic events in a device comprising electromagnetic load 701 may wish to have long "buzz" events operate entirely within the negative impedance/resistance closed loop operating mode (ATTEN=1). The reason for such desire for long "buzz" is that the onset and brake time of such events may be minimized in the closed-loop mode, making for a more pleasing haptic effect to a user, and furthermore the steady state envelope level of the buzz (typically played at resonance of electromagnetic load 701) may be kept more consistently at the target level across unit-to-unit variations and across temperature variations. If during the course of a long buzz event, a sudden input from the user, who may be pressing a virtual button of a device comprising electromagnetic load 701, is to receive acknowledgement of that sudden input by means of a click haptic effect without too much latency between the user input and the click haptic effect, it may be desirable to interrupt the long buzz, by quickly decreasing the value of ATTEN, then playing the open-loop click effect with ATTEN=0, then increasing ATTEN to 1 in order to crisply brake the click once played, then return to finish the duration of the long buzz. In each of these transitions, the level of ATTEN must be managed.

The levels of the playback waveform itself, along with the pilot signal (needed for impedance/resistance estimation used to close the control loop) may also need to be managed in order to provide the most seamless haptic experience to a user.

Figure 10:
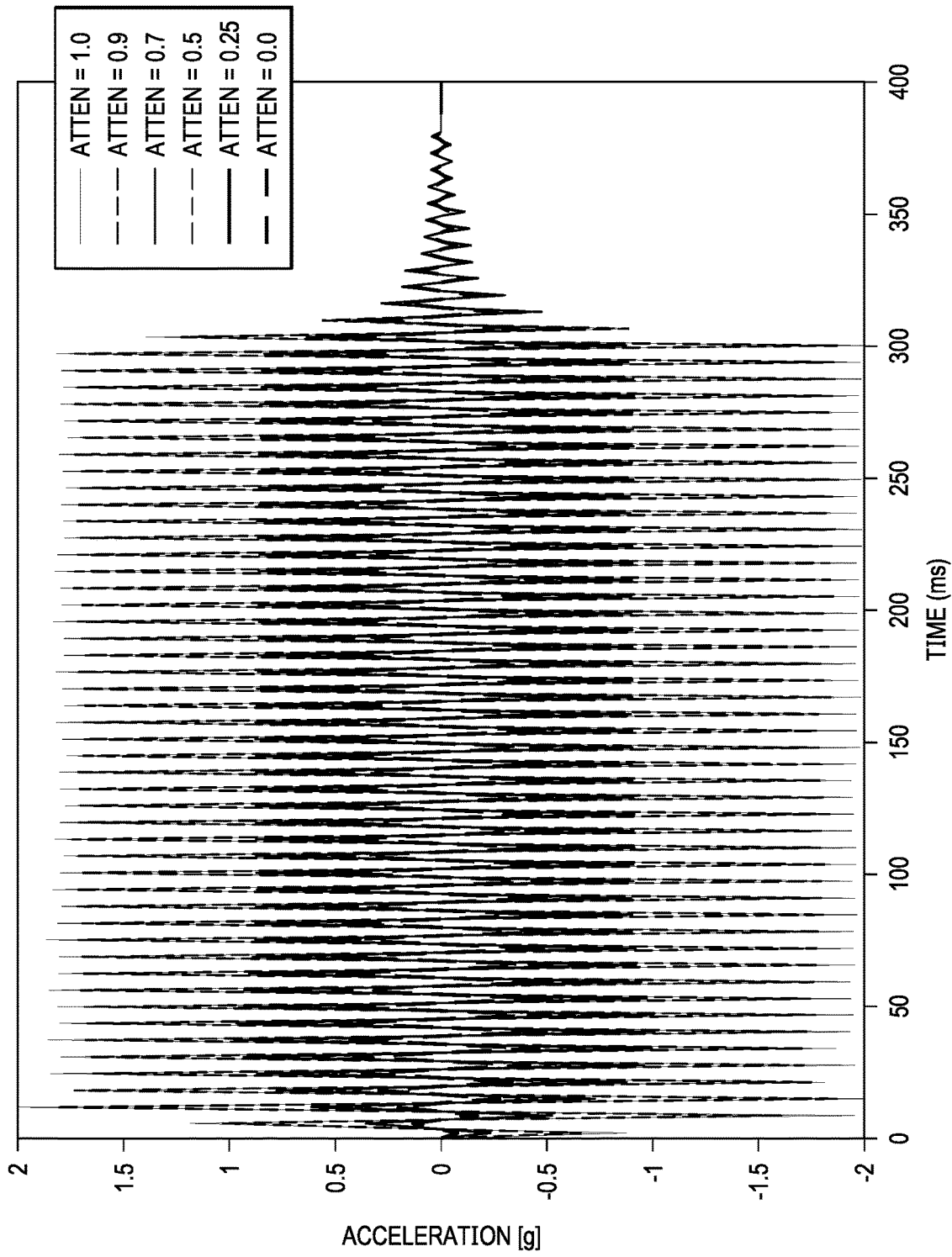
FIG. 10 illustrates a graph of an example acceleration versus time plot that illustrates a problem associated with changing the level of negative impedance feedback correction for the example transducer driving system of FIG. 7, in accordance with embodiments of the present disclosure.

FIG. 10 illustrates a graph of an example acceleration versus time plot for the moving mass of electromagnetic load 701 that illustrates a problem associated with changing (e.g., via the value of ATTEN) the level of negative impedance feedback correction for example transducer driving system 700, in accordance with embodiments of the present disclosure. In particular, FIG. 10 illustrates a particular problem that may be associated with switching between the open-loop mode and closed-loop mode—not only does the amount of time spent during onset and brake/braking vary, but so does the level of the driving waveform during steady state. If, for whatever reason, there is motivation to switch between open- and closed-loop output drive, and the product designer wishes to maintain (at least) a constant haptic effect, level-wise at steady state, then the designer of the product must somehow compensate for the wide variation in level differences shown in FIG. 10.

Figure 11:
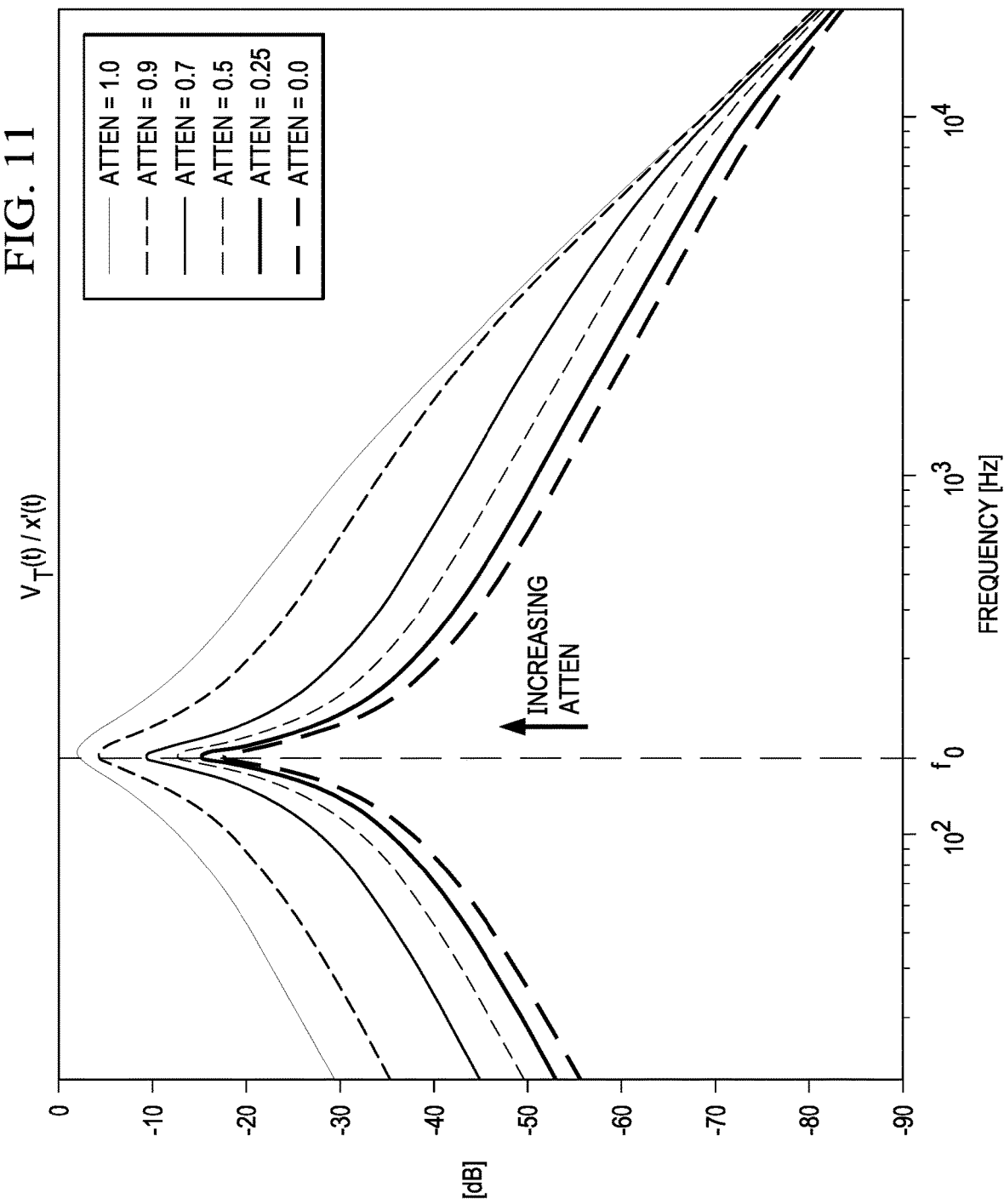
FIG. 11 illustrates a graph of an example plot of a transfer function between a raw transducer driving signal and a sensed terminal voltage $V_T$ (t) for the example transducer driving system of FIG. 7, in accordance with embodiments of the present disclosure.

FIG. 11 illustrates a graph of an example plot of a transfer function between raw transducer driving signal x'(t) and sensed terminal voltage $V_T(t)$ (which may be representative of a back-EMF of electromagnetic load 701) at various levels of control signal ATTEN for example transducer driving system 700, in accordance with embodiments of the present disclosure. FIG. 11 illustrates why the problem discussed above with reference to FIG. 10 may exist, by revealing the transfer function $V_T(t)/x'(t)$ changes as a function of level of the negative impedance/resistance feedback correction applied. In particular, when the amount of negative impedance/resistance feedback correction is modulated by the ATTEN scalar by multiplier 715, then the ratio of sensed terminal voltage $V_T(t)$ to raw transducer driving signal x'(t), which may be referred to as the sensitivity, increases monotonically as a function of increasing ATTEN.

Figure 12:
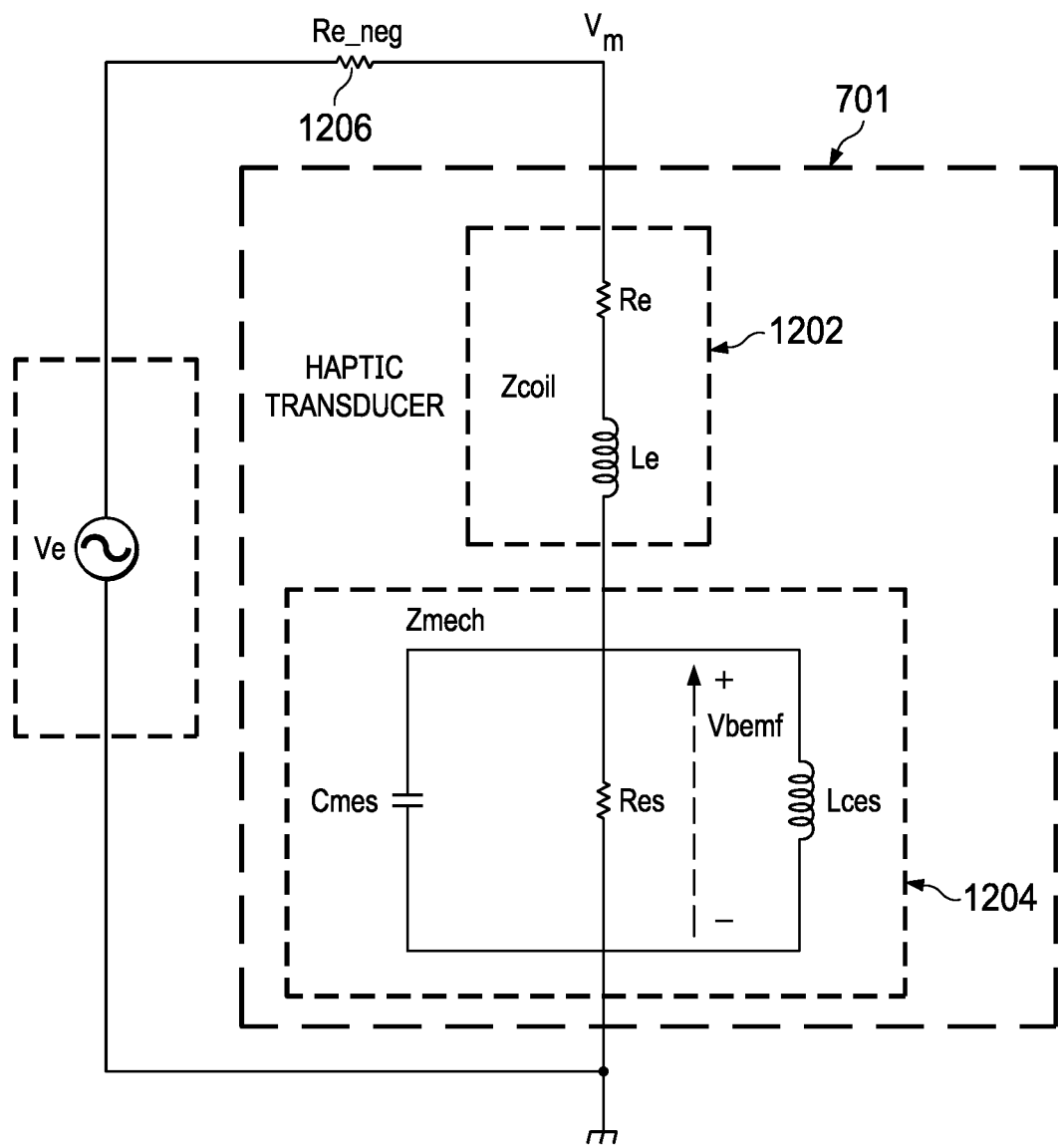
FIG. 12 illustrates an example of a linear resonant actuator (LRA) modelled as a linear system and including a negative resistance, in accordance with embodiments of the present disclosure.

Turning briefly to FIG. 12, FIG. 12 illustrates an example of electromagnetic load 701 modelled as a linear system including electrical components 1202 and electrical model of mechanical components 1204 and including a negative resistance resistor 1206 with negative impedance Re_neg inserted in series with electromagnetic load 701, in accordance with embodiments of the present disclosure. The addition of negative impedance Re_neg may lower quality factor q because effectively it subtracts from DC resistance Re thereby reducing the overall DC electrical impedance.

In practice, negative resistors do not exist. Instead, example transducer driving system 700 may be configured to behave substantially like the circuit shown in FIG. 12, including a mathematical model of negative impedance Re_neg in series with a mathematical model of electromagnetic load 701. In operation, example transducer driving system 700 (e.g., at the output of combiner 726) may in effect compute a voltage $V_m$ that would occur at the junction of negative impedance Re_neg and DC resistance Re as shown in FIG. 12, if, in fact, it were possible to place a physical resistor with negative impedance Re_neg in series with electromagnetic load 701. Computed voltage $V_m$ may then be used to drive electromagnetic load 701.

In essence, example transducer driving system 700 may implement a sensorless velocity control feedback loop for electromagnetic load 701. The feedback loop may use a dynamic estimate of parameters of electromagnetic load 701 and generate feedback (e.g., negative impedance Re_neg) to cancel most of the electrical and mechanical impedance of electromagnetic load 701. In the case of DC coil resistance Re, its estimate must be quite accurate (e.g., <1% error) in order for the feedback loop of example transducer driving system 700 to achieve stability and achieve the desired negative impedance effect. The electrical and mechanical impedance of electromagnetic load 701 may change in response to the stimulus applied to it (e.g., amplitude and frequency of driving signal V(t)), ambient temperature conditions, and/or other factors.

Referring to FIG. 12, a sensitivity H for electromagnetic load 701 may be given as:

$$H = \frac{Vbemf}{Ve} = \frac{Zmech}{(Zmech + Zcoil - \text{Re\_neg} \cdot ATTEN)}$$

At mechanical resonance, Zmech=res and |Zle|<<Re_neg, thus sensitivity at resonance H0 may be given by:

$$H0 = \frac{res}{res + Re_{neg} - \text{Re\_neg} \cdot ATTEN} = \frac{res}{res + Re_{neg}(1 - ATTEN)}$$

Accordingly, a scaling factor REF_LEVEL to be applied to the haptic playback waveform in order to compensate for the problem of changing the level of the negative impedance/resistance feedback correction via control signal ATTEN may be given by:

$$REF_{LEVEL} = \frac{H0(ATTEN = 0)}{H0(ATTEN)} = \frac{res/(res + \text{Re\_neg})}{res + Re_{neg}(1 - ATTEN)/(res + \text{Re\_neg})} =$$

$$\frac{res + Re_{neg}(1 - ATTEN)}{(res + \text{Re\_neg})} = 1 - \left(\frac{Re_{neg}}{res + Re_{neg}}\right) \cdot ATTEN$$

Scaling factor REF_LEVEL may thus be a compensating term that may be used to compensate or normalize the output driving signal (specifically at resonance, but that is often the frequency at which a haptic playback waveform is driven during steady state) as a function of control signal ATTEN.

Figure 13:
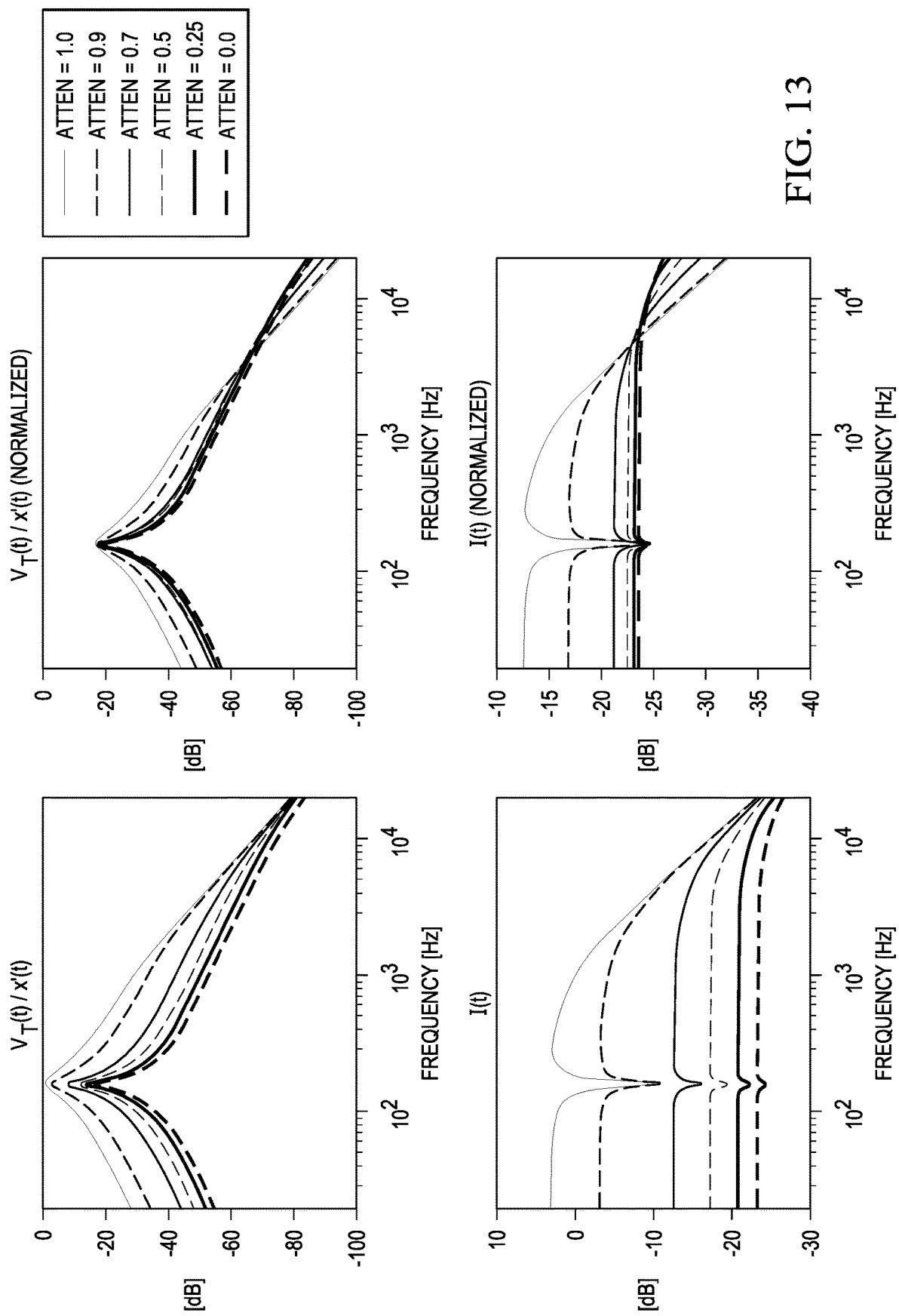
FIG. 13 shows example waveforms for the example transducer driving system of FIG. 7 that illustrate the benefits of the compensation, in accordance with embodiments of the present disclosure.

FIG. 13 shows example waveforms for example transducer driving system 700 that illustrate the benefits of the compensation, in accordance with embodiments of the present disclosure. In particular, the left-hand side of FIG. 13 depicts sensitivity $V_T(t)/x'(t)$ and sensed current I(t) without normalization by scaling factor REF_LEVEL and the right-hand side of FIG. 13 depicts sensitivity $V_T(t)/x'(t)$ and sensed current I(t) with normalization by scaling factor REF_LEVEL.

Figure 14:
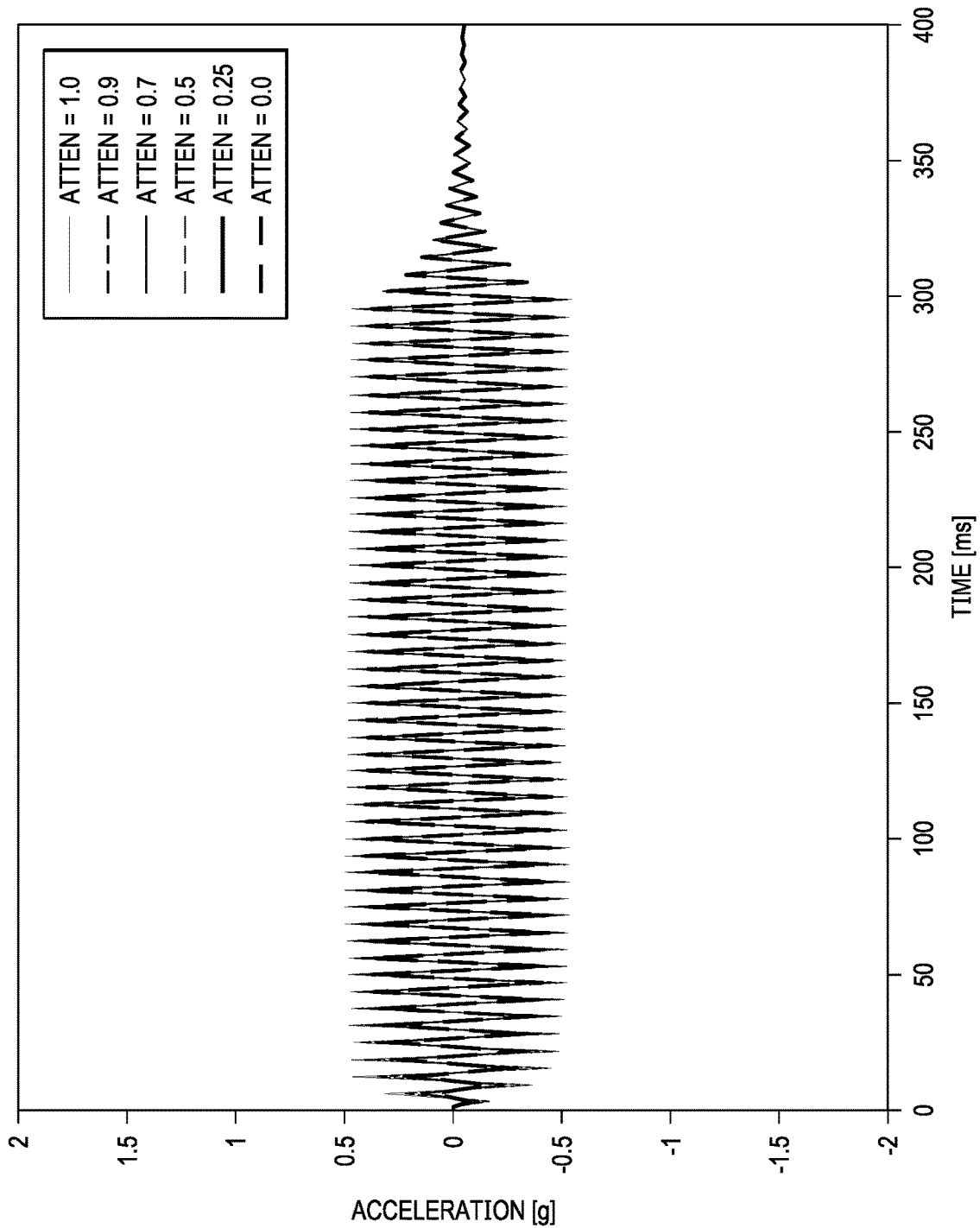
FIG. 14 illustrates a graph of an example acceleration versus time plot with compensation applied for the example transducer driving system of FIG. 7, in accordance with embodiments of the present disclosure.

FIG. 14 illustrates a graph of an example acceleration versus time plot for the moving mass of electromagnetic load 701 with compensation of scaling factor REF_LEVEL applied for example transducer driving system 700, in accordance with embodiments of the present disclosure. When compared with FIG. 10, FIG. 14 demonstrates during the steady state portion of the haptic playback waveform, the variability of acceleration as a function of control signal ATTEN minimized as a result of applying compensation of scaling factor REF_LEVEL. However, FIG. 14 shows that even with such compensation, ringing may occur during onset and ringing may occur during braking that are dependent upon the value of ATTEN.

Figure 15:
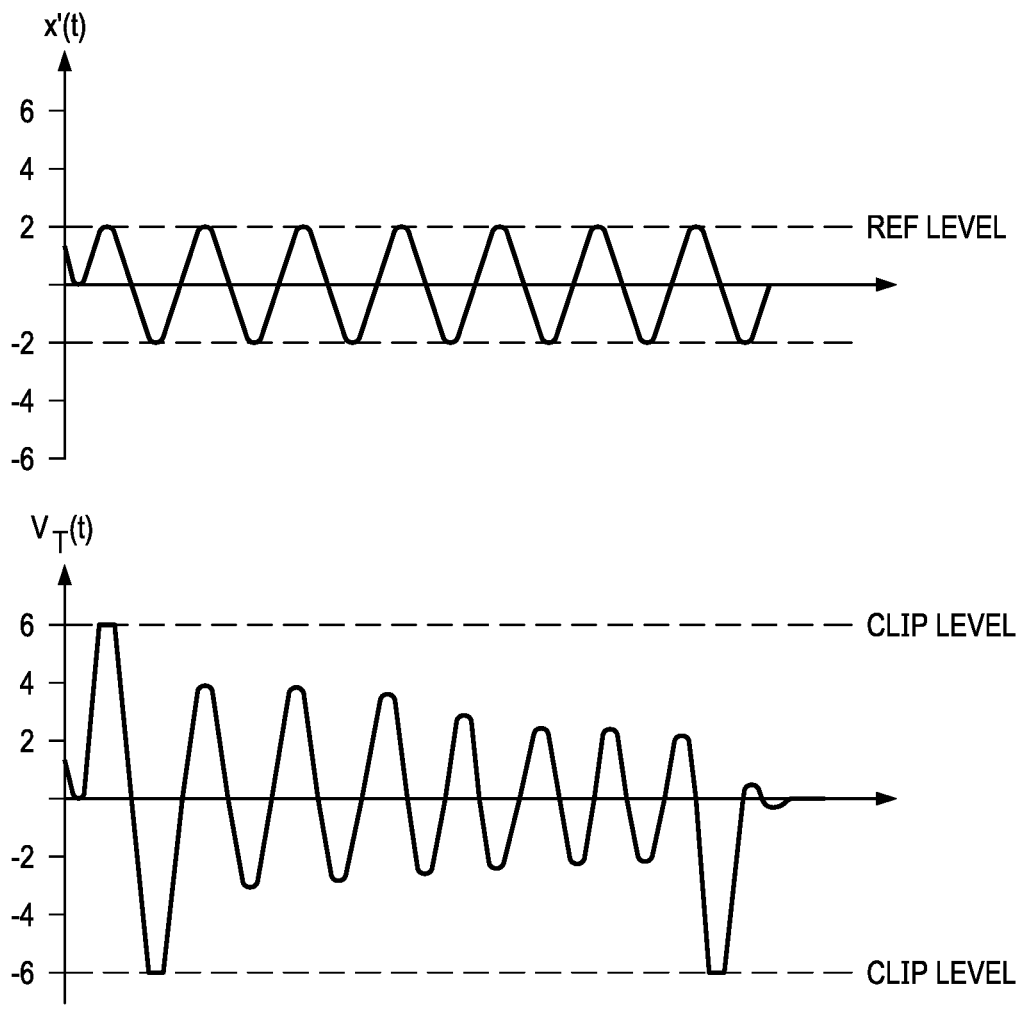
FIG. 15 illustrates graphs of example waveforms associated with the example transducer driving system of FIG. 7 that illustrate a problem associated with driving very large playback waveforms during a closed-loop operating mode, in accordance with embodiments of the present disclosure.

FIG. 15 illustrates graphs of example waveforms associated with example transducer driving system 700 that illustrate a problem associated with driving very large playback waveforms during a closed-loop operating mode, in accordance with embodiments of the present disclosure. In particular, FIG. 15 demonstrates a problem that may occur when driving very large raw transducer driving signal x'(t) while the negative feedback system is fully employed in the closed-loop operating mode (e.g., ATTEN=1). In existing approaches, at onset and brake/braking, the negative impedance/resistance closed-loop system provides significant amplification of raw transducer driving signal x'(t) in order to cause the mass of electromagnetic load 701 to move quickly at onset and stop quickly during braking. In fact, this feature is part of the motivation for using a closed-loop system in a haptic vibrational product. However, when a particularly strong playback waveform is sent to such a closed loop system, it is possible that the onset and braking portions of the resulting signal sent to the amplifier exceed the voltage level at which the amplifier may drive. In such a case, signal clipping may occur, as shown by sensed terminal voltage $V_z(t)$ clipping at a voltage CLIP_LEVEL. Clipping is generally undesirable in haptic vibrational systems, as it can damage the electromagnetic load in the long run and produce an undesirable haptic experience in the short run. During the steady state portion of the waveform, it is possible for there to be no clipping issue (as the amplification gain associated with the closed loop system may have been comprehended by the designer of the haptic playback waveform in choosing a level for the playback waveform to maximize steady state level without clipping).

One way to strike a balance between closed loop levels at steady state and "some" closed loop benefits during onset and braking is to dynamically modulate the ATTEN level specifically during the onset and braking portions of the playback waveform.

Figure 16:
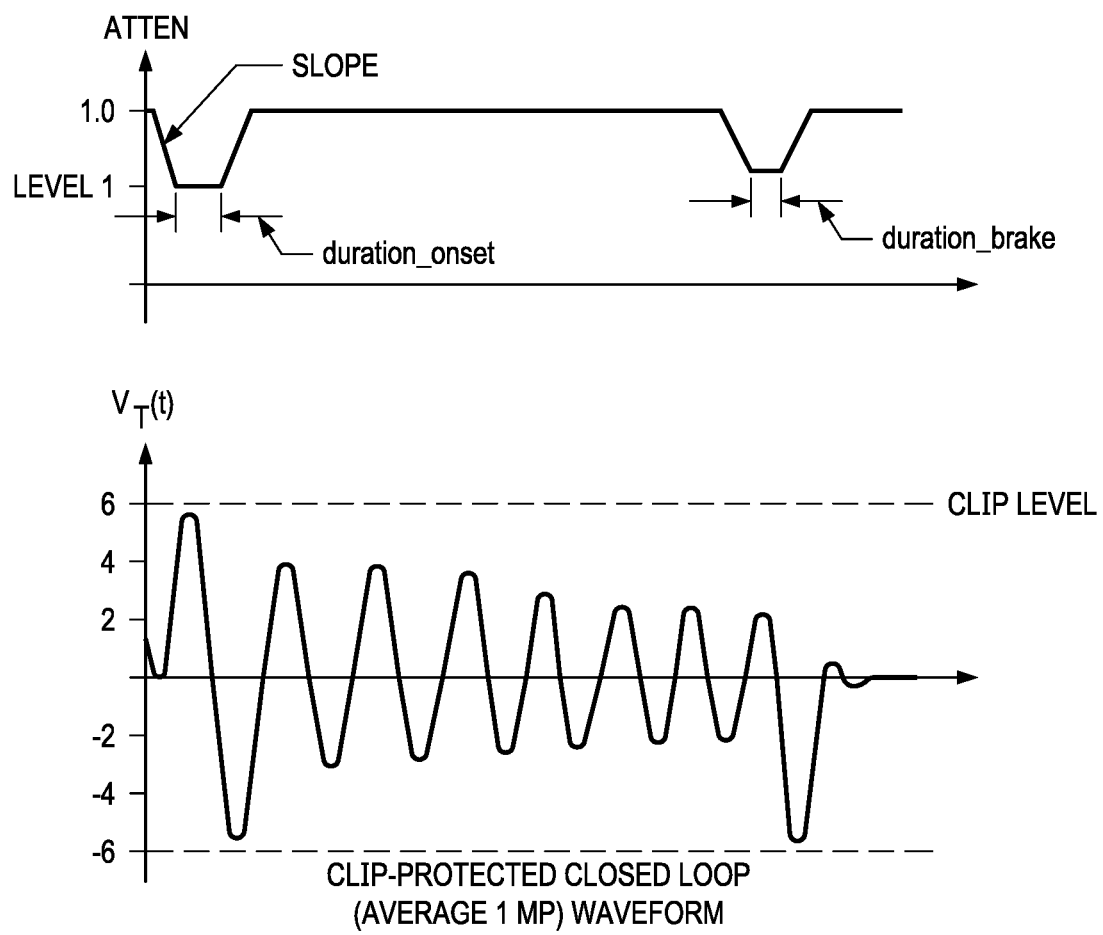
FIG. 16 illustrates graphs of example waveforms for the example transducer driving system of FIG. 7 that depict management of a control signal that strikes a balance between preventing clipping and maintaining closed loop steady state performance, in accordance with embodiments of the present disclosure.

FIG. 16 illustrates graphs of example waveforms for example transducer driving system 700 that depict management of control signal ATTEN that strikes a balance between preventing clipping and maintaining closed loop steady state performance, in accordance with embodiments of the present disclosure. In particular, during onset, when the closed-loop system provides significant gain, the ATTEN value may be briefly decreased to prevent clipping. The amount of decrease, to a level designated as LEVEL_1, may be a function of the amplitude of raw transducer driving signal x'(t) and the voltage level at which amplifier 706 clips. The rate at which ATTEN decreases at onset may be a function of LEVEL_1 and the frequency of the playback waveform (e.g., most probably the resonant frequency as that is the typical driving frequency and is indicative to a degree of how quickly the amplifier output will reach toward clipping). The amount of time that ATTEN may remain at LEVEL_1, illustrated in FIG. 16 as duration_onset, may be a function of the frequency of raw transducer driving signal x'(t). Finally, just as the brief decrease of ATTEN may be provided at onset, it may also be desirable to provide another brief decrease at braking. In such a case, the amount of time that ATTEN may remain at LEVEL_1, illustrated in FIG. 16 as duration_brake, may be a function of the frequency of raw transducer driving signal x'(t).

Although the foregoing discusses application to a linear electromagnetic load, it is understood that systems and methods similar or identical to those disclosed may be applied to other linear or non-linear systems.

Further, although the foregoing contemplates use of a negative impedance/resistance filter to implement a model of an LRA, in some embodiments, a mathematical equivalent to an LRA may be used in lieu of a model.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A method of driving, by a transducer driving system, a playback waveform to an electromagnetic actuator, the method comprising:
   operating the transducer driving system in a first mode wherein the electromagnetic actuator is driven with the playback waveform in a closed loop to form a closed-loop voltage drive system that includes a negative impedance;

operating the transducer driving system in a second mode wherein the electromechanical actuator is driven with the playback waveform in an open loop; and operating a mode switch for transitioning the transducer driving system to operate between the first mode and the second mode.

2. The method of claim 1, wherein the closed loop voltage drive system utilizes a feedback correction signal added to the playback waveform.

3. The method of claim 2, wherein the electromagnetic actuator comprises a haptic actuator, and wherein the playback waveform signal plays back discrete haptic events during one or more of the first mode and the second mode.

4. The method of claim 2, further comprising:
driving, by the transducer driver system, a first portion of a single haptic event as the playback waveform when operating in the first mode; and
driving, by the transducer driver system, a second portion of the single haptic event as the playback waveform when operating in the second mode.

5. The method of claim 4, further comprising ramping, by the mode switch, the feedback correction signal from a first level to a second level when transitioning between the first mode and the second mode.

6. The method of claim 5, wherein the playback waveform associated with the single haptic event plays in its entirety in the second mode, then switches to the first mode at the end of the single haptic event to minimize a brake time, and the method further comprises controlling, by the mode switch, the transition between the first mode and the second mode.

7. The method of claim 5, wherein the playback waveform associated with the single haptic event plays each of its three phases, namely an onset phase, a steady state phase, and a braking phase, and the method further comprises controlling, with the mode switch, transitions between the first mode and the second mode at phase boundaries of the three phases.

8. The method of claim 5, further comprising ramping, by the mode switch, the playback waveform from one level to another level when transitioning between the first mode and the second mode.

9. The method of claim 8, wherein a level of the playback waveform is a function of the feedback correction signal so that the level of the playback waveform driven to the electromechanical actuator is maintained constant, at steady state, for any level of the feedback correction signal.

10. The method of claim 2, further comprising, during the first mode:
ramping down, by the mode switch, the feedback correction signal level during a brief onset portion of the playback waveform to avoid clipping of the playback signal driven to the electromechanical actuator; and
ramping up, by the mode switch, the feedback correction signal level after the brief onset portion of the playback waveform so that a desired signal level is achieved during a steady state portion of the playback waveform.

11. The method of claim 10, wherein a minimum level of the feedback correction signal level to which the mode switch ramps is a function of a level of the playback waveform and a maximum level of the playback waveform at which clipping does not occur.

12. The method of claim 10, wherein a minimum level of the feedback correction signal to which the mode switch ramps is a function of a level of the playback waveform and a maximum level of the playback waveform at which undesirable electromechanical actuator effects are perceived by a user.

13. The method of claim 2, further comprising injecting a pilot signal into the playback waveform for controlling a level of the feedback correction signal.

14. The method of claim 13, further comprising ramping, by the mode switch, the pilot signal level from one level to another level when transitioning between the first mode and the second mode.

15. The method of claim 14, wherein the pilot signal level is a function of a level of the feedback correction signal so that the pilot signal level driven to the electromechanical actuator is maintained constant, at steady state, for any level of the feedback correction signal.

16. The method of claim 14, further comprising disabling the pilot signal during the second mode.

17. The method of claim 13, further comprising modulating the feedback correction signal based on an estimate of an impedance of the electromechanical actuator.

18. A transducer driving system for driving a playback waveform to an electromagnetic actuator, the transducer driving system comprising:
an output for generating the playback waveform; and
a control subsystem configured to:
operate the transducer driving system in a first mode wherein the electromagnetic actuator is driven with the playback waveform in a closed loop to form a closed-loop voltage drive system that includes a negative impedance;
operate the transducer driving system in a second mode wherein the electromechanical actuator is driven with the playback waveform in an open loop; and
operate a mode switch for transitioning the transducer driving system to operate between the first mode and the second mode.

19. The transducer driving system of claim 18, wherein the closed loop voltage drive system utilizes a feedback correction signal added to the playback waveform.

20. The transducer driving system of claim 19, wherein the electromagnetic actuator comprises a haptic actuator, and wherein the playback waveform signal plays back discrete haptic events during one or more of the first mode and the second mode.

21. The transducer driving system of claim 19, wherein the transducer driving system is further configured to:
drive a first portion of a single haptic event as the playback waveform when operating in the first mode; and
drive a second portion of the single haptic event as the playback waveform when operating in the second mode.

22. The transducer driving system of claim 21, wherein the mode switch is further configured to ramp the feedback correction signal from a first level to a second level when transitioning between the first mode and the second mode.

23. The transducer driving system of claim 22, wherein the playback waveform associated with the single haptic event plays in its entirety in the second mode, then switches to the first mode at the end of the single haptic event to minimize a brake time, and wherein the mode switch is further configured to control the transition between the first mode and the second mode.

24. The transducer driving system of claim 22, wherein the playback waveform associated with the single haptic event plays each of its three phases, namely an onset phase, a steady state phase, and a braking phase, and wherein the mode switch is further configured to control transitions between the first mode and the second mode at phase boundaries of the three phases.

25. The transducer driving system of claim 22, wherein the mode switch is further configured to ramp the playback waveform from one level to another level when transitioning between the first mode and the second mode.

26. The transducer driving system of claim 25, wherein a level of the playback waveform is a function of the feedback correction signal so that the level of the playback waveform driven to the electromechanical actuator is maintained constant, at steady state, for any level of the feedback correction signal.

27. The transducer driving system of claim 19, wherein the mode switch is further configured to, during the first mode:
- ramp down the feedback correction signal level during a brief onset portion of the playback waveform to avoid clipping of the playback signal driven to the electromechanical actuator; and
- ramp up the feedback correction signal level after the brief onset portion of the playback waveform so that a desired signal level is achieved during a steady state portion of the playback waveform.

28. The transducer driving system of claim 27, wherein a minimum level of the feedback correction signal level to which the mode switch ramps is a function of a level of the playback waveform and a maximum level of the playback waveform at which clipping does not occur.

29. The transducer driving system of claim 27, wherein a minimum level of the feedback correction signal to which the mode switch ramps is a function of a level of the playback waveform and a maximum level of the playback waveform at which undesirable electromechanical actuator effects are perceived by a user.

30. The transducer driving system of claim 19, further comprising a pilot tone generator configured to inject a pilot signal into the playback waveform for controlling a level of the feedback correction signal.

31. The transducer driving system of claim 30, wherein the mode switch is further configured to ramp the pilot signal level from one level to another level when transitioning between the first mode and the second mode.

32. The transducer driving system of claim 31, wherein the pilot signal level is a function of a level of the feedback correction signal so that the pilot signal level driven to the electromechanical actuator is maintained constant, at steady state, for any level of the feedback correction signal.

33. The transducer driving system of claim 31, further comprising disabling the pilot tone generator from generating the pilot signal during the second mode.

34. The transducer driving system of claim 30, wherein the transducer driving system is further configured to modulate the feedback correction signal based on an estimate of an impedance of the electromechanical actuator.

* * * * *